US007847719B2

(12) United States Patent
Nguyen et al.

(10) Patent No.: US 7,847,719 B2
(45) Date of Patent: Dec. 7, 2010

(54) SIGNAL PROCESSORS, SIGNAL PROCESSING METHODS, AND DIGITAL FILTER CONFIGURATION METHODS

(75) Inventors: Ha T. Nguyen, San Jose, CA (US); Minh N. Do, Champaign, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 16 days.

(21) Appl. No.: 12/482,711

(22) Filed: Jun. 11, 2009

(65) Prior Publication Data

US 2009/0315750 A1 Dec. 24, 2009

Related U.S. Application Data

(60) Provisional application No. 61/060,716, filed on Jun. 11, 2008.

(51) Int. Cl.
*H03M 1/12* (2006.01)

(52) U.S. Cl. ...................................... 341/155; 375/219

(58) Field of Classification Search ......... 341/155–165; 375/219, 334

See application file for complete search history.

(56) References Cited

U.S. PATENT DOCUMENTS

| | | | | |
|---|---|---|---|---|
| 5,568,142 | A | 10/1996 | Velazquez et al. | |
| 6,334,051 | B1 * | 12/2001 | Tsurumi et al. | 455/324 |
| 7,532,728 | B2 * | 5/2009 | Venkatesan et al. | 381/23 |
| 7,545,855 | B2 * | 6/2009 | Afsahi et al. | 375/219 |
| 7,545,856 | B2 * | 6/2009 | Behzad et al. | 375/219 |
| 7,653,152 | B2 * | 1/2010 | Al-Eidan | 375/334 |

OTHER PUBLICATIONS

Nguyen, Ha T. and Do, Minh N., "Signal Reconstruction from a Periodic Nonuniform Set of Samples Using H (Infinity) Optimization", SPIE Symposium on Electonic Imaging, San Jose, USA Jan. 2007.

Nguyen, Ha T., and Do, Minh N., "Robust Multichannel Sampling", IEEE International Conference on Image Processing, San Diego, 2008.

Nyguyen, Ha T. and Do, Minh N., "Hybrid Filter Banks with Fractional Delays: Minimax Design and Application to Multichannel Sampling", IEEE Transactions on Signal Processing, Jul. 2008, vol. 56, Issue 7, pp. 3180-3190.

* cited by examiner

*Primary Examiner*—Lam T Mai
(74) *Attorney, Agent, or Firm*—Wells St. John, P.S.

(57) ABSTRACT

Signal processors, signal processing methods, and digital filter configuration methods are discussed. In one arrangement, a signal processor includes a common node; a plurality of channels, each channel of the plurality comprising an analog filter, a sampler, and a digital filter and each channel of the plurality being configured to generate an intermediate digital signal using an analog signal presented at the common node; and processing circuitry configured form a digital signal representing the analog signal from the intermediate digital signals.

20 Claims, 19 Drawing Sheets

(a) The desired high-rate system.

(b) The low-rate system.

SIGNAL PROCESSORS, SIGNAL PROCESSING METHODS, AND DIGITAL FILTER CONFIGURATION METHODS

CROSS REFERENCE TO RELATED APPLICATION

This application claims priority to U.S. Provisional Patent Application Ser. No. 61/060,716 which was filed on Jun. 11, 2008, the entirety of which is incorporated by reference herein.

GOVERNMENT RIGHTS STATEMENT

This invention was made with government support by the National Science Foundation under Grant ITR-0312432. The Government may have certain rights in the invention.

TECHNICAL FIELD

The present disclosure relates generally to signal processors, signal processing methods, and digital filter configuration methods.

BACKGROUND

Analog to Digital (A/D) converters are widely used in electronics to convert an analog signal to a digital signal. An A/D converter may have an associated sampling rate, which may be the rate at which the A/D converter samples the analog signal. To capture the frequency content of high frequency analog signals, an A/D converter having a high sampling rate may be used. However, for some high frequency signals, an A/D converter having a sampling rate high enough to capture the frequency content of the signals may be prohibitively expensive. Furthermore, some signals may have frequency content so high that an A/D converter is unable to capture the frequency content of the signal.

SUMMARY

Signal processors, signal processing methods, and digital filter configuration methods are discussed.

In one arrangement, a signal processor includes a common node; a plurality of channels, each channel of the plurality comprising an analog filter, a sampler, and a digital filter and each channel of the plurality being configured to generate an intermediate digital signal using an analog signal presented at the common node; and processing circuitry configured form a digital signal representing the analog signal from the intermediate digital signals.

In another arrangement, a signal processing method includes using a first sampling device, sampling an analog signal to produce a first digital signal having a first sampling rate; using a second sampling device, sampling the analog signal to produce a second digital signal having a second sampling rate; and using the first digital signal and the second digital signal, forming a third digital signal having a third sampling rate, the third sampling rate being greater than both the first rate and the second rate.

In yet another arrangement, a digital filter configuration method includes accessing information describing characteristics of an analog to digital converter. The analog to digital converter is configured to form a digital signal representing an analog signal from a plurality of intermediate digital signals generated respectively by a plurality of channels of the analog to digital converter configured to sample the analog signal. Each channel of the plurality comprises a different digital filter relative to one another.

The method also includes using the information to determine filter parameters for the digital filters and configuring the digital filters with the filter parameters.

BRIEF DESCRIPTION OF THE DRAWINGS

FIG. 1A is a block diagram of a signal processor in accordance with an embodiment of the present disclosure.

FIG. 3 is a block diagram of a signal processing system in accordance with an embodiment of the present disclosure.

FIG. 5 illustrates a system for approximation of a high-resolution signal in accordance with an embodiment of the present disclosure.

FIG. 10 illustrates an induced error system in accordance with an embodiment of the present disclosure.

FIG. 13 illustrates a magnitude response and phase response in accordance with an embodiment of the present disclosure.

DESCRIPTION

This disclosure is submitted in furtherance of the constitutional purposes of the U.S. Patent Laws "to promote the progress of science and useful arts" (Article 1, Section 8).

An analog signal may be sampled at a very high rate to produce a digital version of the analog signal. Digital devices, such as computers, may subsequently be used to process the digital version of the signal. If the analog signal is sampled at an appropriate sampling rate, the digital version of the signal may adequately capture information present in the analog signal. For example, it may be desirable to sample an analog signal having frequency content of 30 GHz at a sampling rate of 60 GHz using an A/D converter capable of sampling at a rate of 60 GHz.

Alternatively, a plurality of A/D converters may be used in parallel to digitize the analog signal. Individual A/D converters of the plurality may operate at a lower sampling rate than if a single A/D converter was used to sample the analog signal. For example, three A/D converters operating at 20 GHz may each sample the analog signal. The resulting digital signals may be filtered using digital filters and then combined to form a single 60 GHz digital signal. Doing so may be advantageous since three 20 GHz A/D converters may cost less than a single A/D converter capable of operating at 60 GHz.

Figure 1:
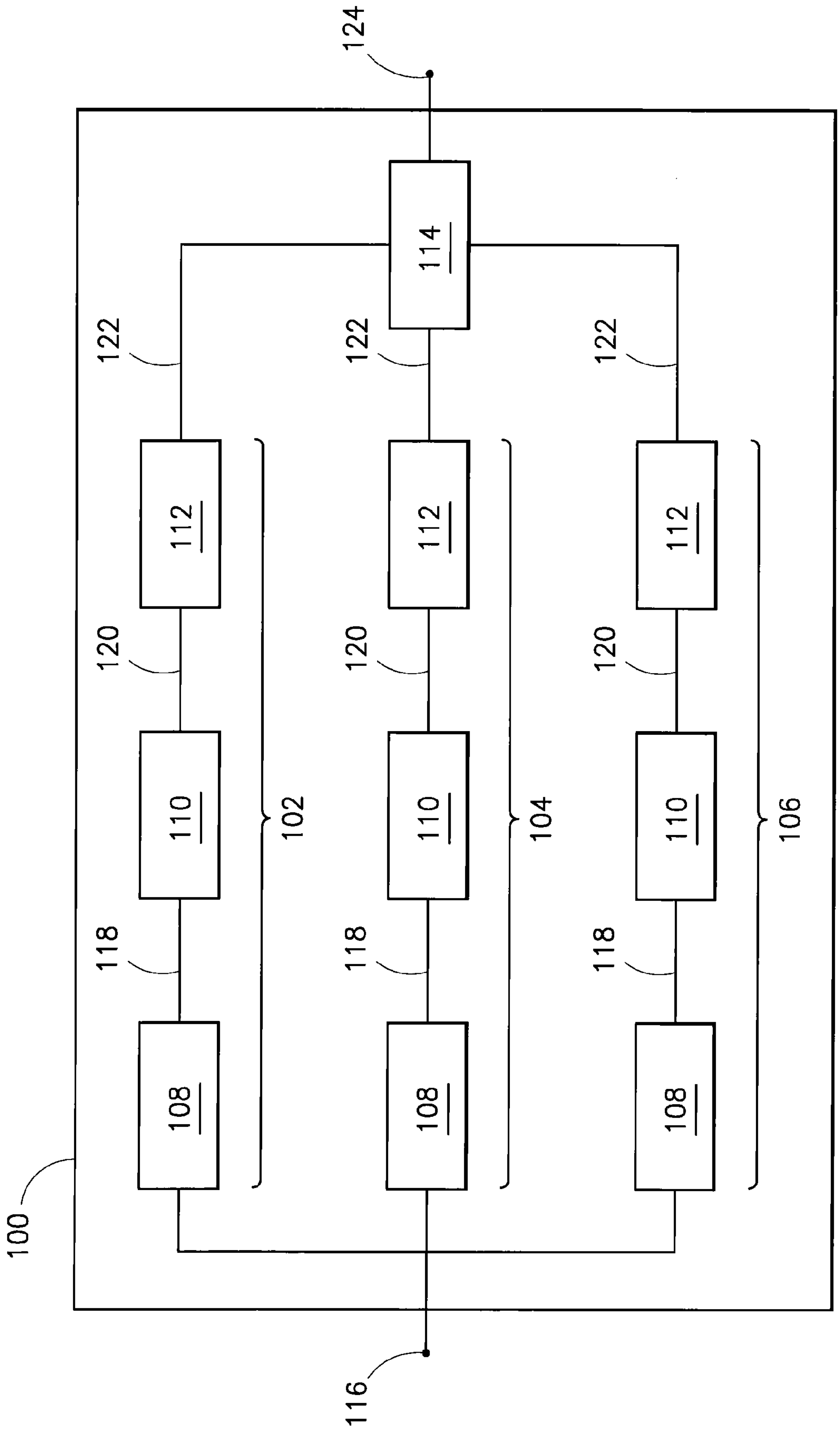
FIG. 1 is a block diagram of a signal processor in accordance with an embodiment of the present disclosure.

Referring to FIG. 1, a functional block diagram of an A/D converter 100 (which may alternatively be referred to as a signal processor) is illustrated. A/D converter 100 may receive an analog input signal at 116 and may provide a digital version of the analog signal at 124. A/D converter 100 includes three channels 102, 104, and 106. Each channel includes an A/D converter 108, an upsampler 110, and a digital filter 112. Although only three channels are illustrated in FIG. 1, other embodiments are possible including embodiments having more than three channels.

A/D converters 108 may sample the analog input signal at a first sampling rate and provide a digital version of the analog signal based on the samples at nodes 118. Upsamplers 110 may convert the digital signals present at nodes 118 so that the digital signals have a second sample rate higher than the first sample rate and may provide the upsampled versions of the digital signals at nodes 120. Digital filters 112 may filter the digital signals present on nodes 120 and provide the filtered digital signals to node 122. In some embodiments, digital filters 112 may be finite impulse response (FIR) filters. In other embodiments, digital filters 112 may be infinite impulse response (IIR) filters.

A/D converter 100 also includes a signal combiner 114. Signal combiner 114 may combine the filtered digital signals from nodes 122, for example by summing the signals from nodes 122 together, to produce a combined digital signal and may provide the combined digital signal to node 124. The combined digital signal at node 124 may have the second sample rate.

The digital signal at node 124 may represent the analog signal presented to A/D converter 100 at node 116. The signal at node 124 is not identical to the signal at node 116, of course, because the signal at node 124 is a digital signal and the signal at node 116 is an analog signal. However, the signal at node 124 may adequately represent information present in the analog signal presented to node 116.

By way of example, A/D converter 100 may produce a digital signal at node 124. The digital signal at node 124 may be a digital version of an analog signal presented at node 116 and may have a sample rate of 60 GHz. Each channel of A/D converter 100 may digitize the analog signal presented at node 116 using A/D converters 108. The digital signals generated by A/D converters 108 may have a sample rate of 20 GHz.

Upconverters 110 may convert the digital signals at nodes 118 thereby generating signals at nodes 120 having a sample rate of 60 GHz. Filters 112 may filter the signals received from nodes 120, but might not alter the sample rate of the signals. Accordingly, the sample rate of the signals at nodes 122 may be 60 GHz. Combiner 114 may combine the 60 GHz digital signals from nodes 122 into a single digital signal having a sample rate of 60 GHz and may present the combined signal at node 124.

Accordingly, A/D converter 100 may produce a digital signal with a sample rate of 60 GHz representing the analog signal presented at node 116 using A/D converters 108 having a sampling rate of 20 GHz.

A/D converter 100 may be implemented in one or more of a number of different ways. For example, A/D converter 100 may be implemented in a single integrated circuit such as an ASIC. Alternatively, A/D converter 100 may be implemented as instructions executed by a digital signal processing integrated circuit. In some embodiments, A/D converter 100 may be implemented in a plurality of integrated circuits.

Referring to FIG. 1A, a functional block diagram of another A/D converter 150 is illustrated. Like A/D converter 100, A/D converter 150 may receive an analog input signal at 116 and may provide a digital version of the analog signal at 124. A/D converter 150 includes channels 102, 104, and 106 described above. However, in A/D converter 150, channels 102, 104, and 106 include A/D converters 108 and filters 112 but do not include upconverters 110. In addition, A/D converter 150 includes interleaver 152 instead of signal combiner 114.

A/D converters 108 may sample the analog input signal at a first sampling rate (e.g., 20 GHz) as described above and provide a digital version of the analog signal presented at node 116 to nodes 152. Digital filters 112 may filter the digital signals present on nodes 152 and provide the filtered digital signals to nodes 154. The filtered digital signals on nodes 154 may have the same sample rate as the digital signals on nodes 152 (e.g., 20 GHz).

Interleaver 152 may interleave the digital signals present on nodes 154 to produce a single digital signal having a second sampling rate higher than the first sampling rate (e.g., 60 GHz). Interleaver 152 may provide the single digital signal on node 124. Accordingly, A/D converter 150 may produce a digital signal with a sample rate of 60 GHz representing the analog signal presented at node 116 using A/D converters 108 having a sampling rate of 20 GHz.

Advantageously, A/D converter 150 may produce the digital signal using filters 112 operating on digital signals having the first sample rate, which may be less expensive than using filters 112 operating on digital signals having the second sample rate as in A/D converter 100 described above.

Figure 2A:
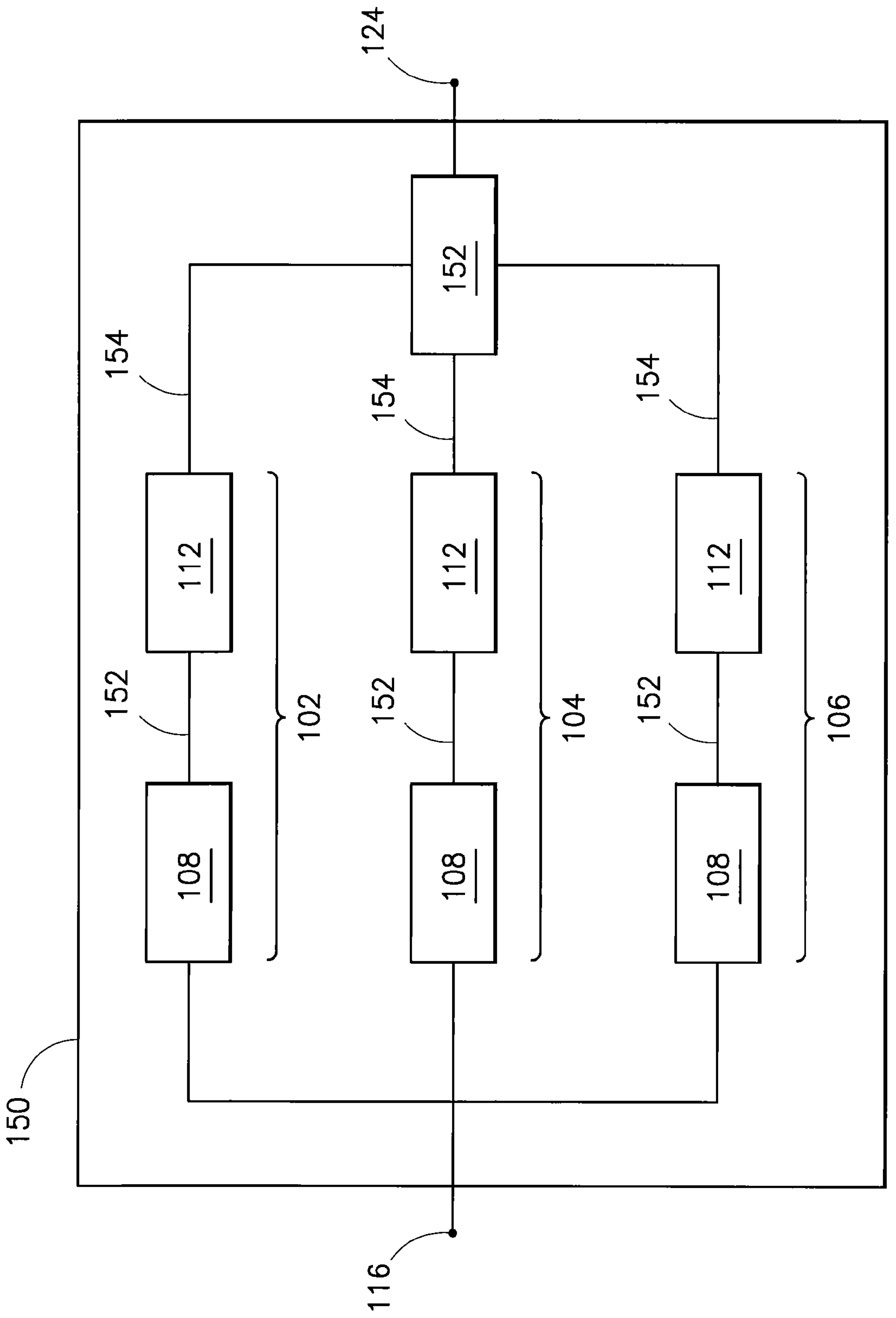
FIG. 2 is a block diagram of an A/D converter in accordance with an embodiment of the present disclosure.
Figure 2:
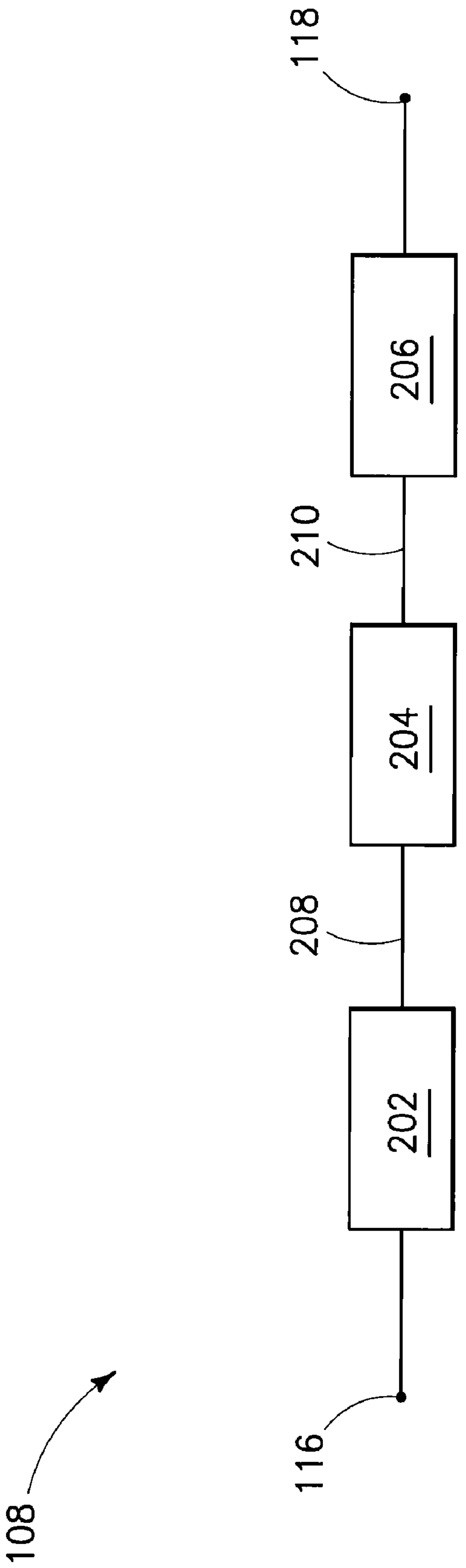

Referring to FIG. 2, a functional block diagram of A/D converters 108 (described above) is illustrated. A/D converters 108 may be individually represented as a delay 202, an analog filter 204, and a sampler 206.

Delay 202 may represent the time delay from when a signal is first presented at node 116 to when the signal is sampled by sampler 206. The time delay may be due to a physical distance between node 116 (e.g., a pin on an integrated circuit) and sampler 206. The time delay may be influenced by other factors as well such as temperature and humidity.

Analog filter 204 may be a low-pass anti-aliasing filter having a particular bandwidth. Accordingly, analog filter 204 may bandlimit the analog signal presented at node 116. Analog filter 204 may present the bandlimited analog signal at node 210. Analog filter 204 may by characterized by a transfer function. Sampler 206 may periodically sample the analog signal present at node 210 using a period associated with a sample rate. Sampler 206 may represent the samples of the analog signal as binary numbers.

Returning now to FIGS. 1 and 1A, filter parameters used by filters 112 may be determined so that the digital signal at node 124 accurately represents the analog signal presented at node 116. Methods for determining the filter parameters are discussed in detail below. The following discussion provides an overview of the methods.

In one embodiment, the filter parameters may be determined based on characteristics of A/D converters 108. The characteristics may include amounts of time delay introduced by delays 202, transfer functions of analog filters 204, and sample rates of samplers 206. The number of channels present in an A/D converter may also influence the determination of the filter parameters.

The filter parameters may be determined in a number of configurations. For example, the filter parameters may be determined for A/D converters in which: transfer functions of analog filters 204 of A/D converters 108 are different from each other, delays 202 of A/D converters 108 are different from each other; samplers 206 of A/D converters 108 sample at different rates from each other; delays 202 of A/D converters 108 are rational multiples of the sampling interval of samplers 206; and/or delays 202 of A/D converters 108 are irrational multiples of the sampling interval of samplers 206.

Referring to FIG. 3, a system 300 for determining filter parameters of filters 112 is illustrated. System 300 includes A/D converter 100 and nodes 116 and 124 (described above) as well as processing circuitry 302.

Processing circuitry 302 may comprise circuitry configured to implement desired programming provided by appropriate media in at least one embodiment. For example, processing circuitry 302 may be implemented as one or more of a processor and/or other structure configured to execute executable instructions including, for example, software and/or firmware instructions, and/or hardware circuitry. Exemplary embodiments of processing circuitry 302 include hardware logic, FPGA, ASIC, state machines, and/or other structures alone or in combination with a processor. These examples of processing circuitry 302 are for illustration and other configurations are possible. In some embodiments, processing circuitry 302 may include one or more analog and/or digital signal generators and may include one or more A/D converters.

In one embodiment, processing circuitry 302 may determine the filter parameters of filters 112. To do so, processing circuitry 302 may access signals present on nodes within A/D converter 100 such as nodes 116, 118, 120, 122, 124, 152, 154, 208, and 210. In some embodiments, the signals present at these nodes may be referred to as intermediate signals.

In one configuration, processing circuitry 302 may determine the filter parameters while A/D converter 100 is actively converting an analog signal presented at node 116 into a digital signal. For example, processing circuitry 302 may access the analog signal presented at node 116 and the signals presented at nodes 118 and use these signals to determine the time delays introduced by delays 202 and the transfer functions of analog filters 204, for example by comparing the analog signal of node 116 to the signals at nodes 118.

In one configuration, processing circuitry 302 may determine the filter parameters while A/D converter 100 is in a calibration mode. In this configuration, processing circuitry 302 may present a test signal at node 116 and may then access analog and/or digital signals at other nodes of A/D converter 100 and use the accessed signals to determine the filter parameters. For example, processing circuitry 302 may access the signals presented at nodes 118, 210, 120, and/or 122 and use these signals to determine the time delays introduced by delays 202 and the transfer functions of analog filters 204, for example by comparing the analog signal of node 116 to the signals at nodes 118.

Processing circuitry 302 may additionally or alternatively configure A/D converter 100. For example, processing circuitry 302 may configure sampling rates of samplers 206 and/or configure filters 112 with filter parameters.

In one embodiment, processing circuitry 302 may determine one or more sampling rates used by samplers 206 based on an error bound. Processing circuitry 302 may determine the error bound. The error bound may represent a maximum amount of error that may be present in the digital signal of node 124. The error may represent a difference between the digital signal of node 124 (which may have a sample rate equal to a second rate and as is described above, may be generated using a plurality of A/D converters operating at a first rate) and a digital signal produced by a single A/D converter operating at a second rate, which is higher than the first rate.

Processing circuitry 302 may determine an acceptable error bound for a configuration of A/D converter 100. For example, processing circuitry 302 may access an error bound value provided by an operator or user of A/D converter 100. Based on the error bound, processing circuitry 302 may determine one or more sampling rates at which samplers 206 may operate so that the error present in the digital signal of node 124 is within the error bound. In some embodiments, as the sampling rates of samplers 206 are increased, the error bound also increases and as the sampling rates are decreased the error bound decreases. A method for calculating the error bound is described below.

At least some embodiments or aspects described herein may be implemented using programming stored within appropriate storage circuitry and/or communicated via a network or other transmission media and configured to control appropriate processing circuitry. For example, programming may be provided via appropriate media including, for example, embodied within articles of manufacture. In another example, programming may be embodied within a data signal (e.g., modulated carrier wave, data packets, digital representations, etc.) communicated via an appropriate transmission medium, such as a communication network (e.g., the Internet and/or a private network), wired electrical connection, optical connection and/or electromagnetic energy, for example, via a communications interface, or provided using other appropriate communication structure. Exemplary programming including processor-usable code may be communicated as a data signal embodied in a carrier wave in but one example.

In one embodiment, a signal processor (e.g., A/D converter 100 of FIG. 1) includes a common node (e.g., node 116 of FIG. 1) and a plurality of channels (e.g., channels 102, 104, and 106 of FIG. 1). Each channel of the plurality includes an analog filter (e.g., filter 204 of FIG. 2), a sampler (e.g., sampler 206 of FIG. 2), and a digital filter (e.g., filter 112 of FIG. 1). Each channel of the plurality is configured to generate an intermediate digital signal using an analog signal presented at the common node. The signal processor also includes processing circuitry (e.g., combiner 114 and interleaver 152) configured to form a digital signal representing the analog signal from the intermediate digital signals.

In one embodiment, the intermediate digital signals may have individual sample rates and the sum of the individual sample rates may be equal to a sample rate of the digital signal representing the analog signal. In another embodiment, the intermediate digital signals may have individual sample rates and the sum of the individual sample rates might not be equal to a sample rate of the digital signal representing the analog signal.

Transfer functions of the analog filters may be different relative to one another. The transfer functions may have different center frequencies relative to one another. For example, the transfer functions have different passbands relative to one another and at least some of the passbands might not overlap in frequency. The passband may be a frequency range in which signals passing through the filter that are within the frequency range are not attenuated or are minimally attenuated (e.g., by less than 3 dB). In one embodiment, the passband of one of the analog filters may span from a first frequency to a second frequency and the passband of another one of the analog filters may span from a third frequency to a fourth frequency where the third and fourth frequencies are both higher than the second frequency. In some cases, the passbands of the analog filters may be arranged so that a contiguous frequency range is covered by the passbands so that all frequencies within the contiguous frequency range fall within the passband of at least one of the analog filters.

The digital filters may be configured to operate using filter parameters determined using transfer functions of the analog filters. In one embodiment, the digital filters may be finite impulse response filters. In another embodiment, the digital filters may be infinite impulse response filters.

The digital filters may be configured to operate using filter parameters determined using information related to propagation delays experienced by a signal propagating from the common node (e.g., node 116) to the samplers (e.g., sampler 206).

In one embodiment, a signal processing method includes using a first sampling device, sampling an analog signal to produce a first digital signal having a first sampling rate, using a second sampling device, sampling the analog signal to produce a second digital signal having a second sampling rate, and using the first digital signal and the second digital signal, forming a third digital signal having a third sampling rate. The third sampling rate is greater than both the first rate and the second rate.

The first sampling rate may be different from the second sampling rate. For example, A/D converter 108 (which includes a sampler) of channel 102 may sample at a first rate and A/D converter 108 (which also includes a sampler) of channel 104 may sample at a second rate that is different from the first rate.

The method may also include using a third sampling device, sampling the analog signal to produce a fourth digital signal having a fourth sampling rate. Forming the third digital signal may include forming the third digital signal using the fourth digital signal. The third sampling rate may be greater than the fourth sampling rate.

Forming the third digital signal may include interleaving samples of the first digital signal with samples of the second digital signal. For example, the first and second digital signals may be interleaved using the techniques described above in relation to FIG. 1A.

The method may also include prior to the forming of the third digital signal: upsampling the first digital signal to have the third sampling rate; upsampling the second digital signal to have the third sampling rate; and wherein the forming of the third digital signal comprises forming the third digital signal using the upsampled first digital signal and the upsampled second digital signal.

In one embodiment, a digital filter configuration method includes accessing information describing characteristics of an analog to digital converter. The analog to digital converter is configured to form a digital signal representing an analog signal from a plurality of intermediate digital signals generated respectively by a plurality of channels of the analog to digital converter. The channels are configured to sample the analog signal. Each channel of the plurality has a different digital filter relative to one another (e.g., filter 112 of channel 102 may be physically and/or logically distinct from filter 112 of channel 104). The method also includes using the information to determine filter parameters for the digital filters and configuring the digital filters with the filter parameters.

Each channel of the plurality may include a different analog filter relative to one another and the information may describe transfer functions of the analog filters. Each channel of the plurality may include a different sampler relative to one another and the information may describe sampling rates of the samplers.

The plurality of channels may consist of a particular quantity of channels and the information may indicates the particular quantity. For example, A/D converter 100 of FIG. 1 includes 3 channels 102, 104, and 106. Accordingly, information describing characteristics of A/D converter 100 may indicate that A/D converter 100 has three channels.

Each channel of the plurality may comprise a different sampler relative to one another and the information may be based on propagation delays between a node common to the channels of the plurality and the samplers.

The sampler of a first one of the channels may be configured to operate at a sampling rate and the propagation delay between the common node and the sampler of the first one of the channels may be an irrational multiple of a sampling interval associated with the sampling rate.

Determining the filter parameters may include using a portion of the information related to a first one of the channels to determine a subset of the filter parameters and configuring may include configuring the digital filter of a second one of the channels with the subset of the filter parameters. For example, information related to channel 102 and/or channel 106 of FIG. 1 may be used to determine filter parameters for filter 112 of channel 104.

Figure 4:
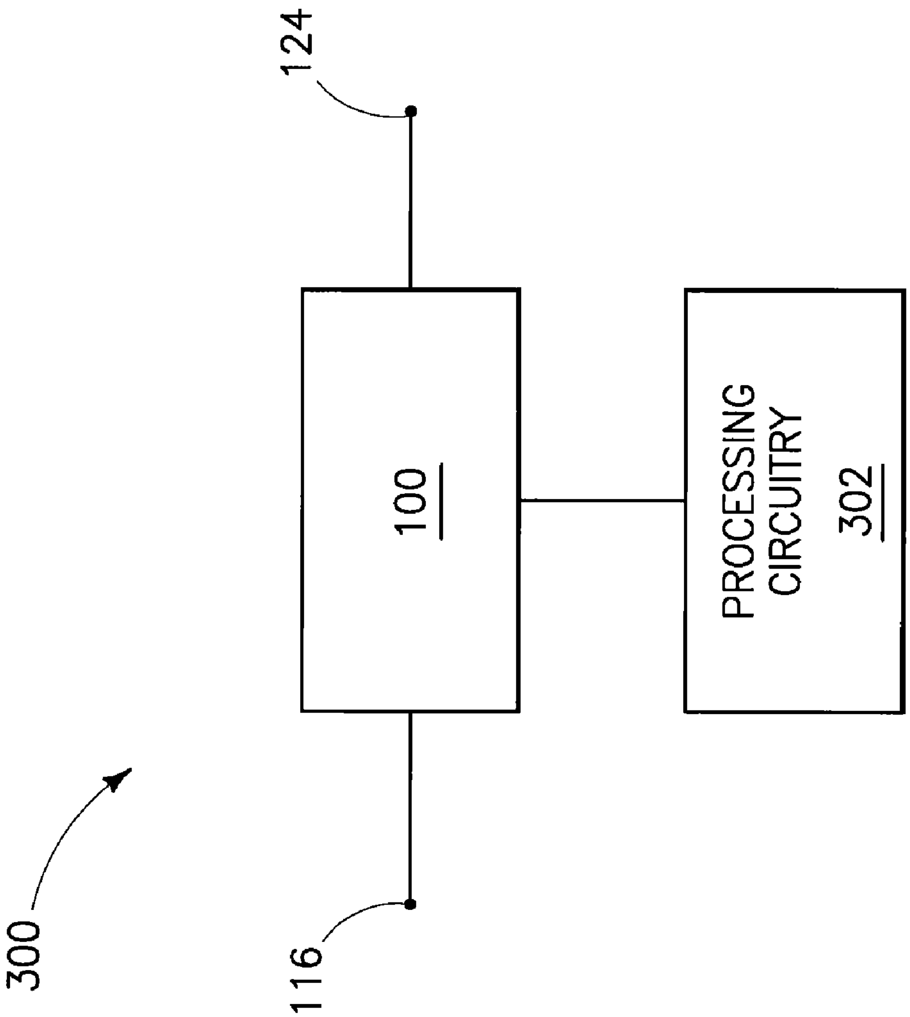
FIG. 4 illustrates a high-rate A/D converter system and a low-rate A/D converter system in accordance with an embodiment of the present disclosure.
Figure 4:
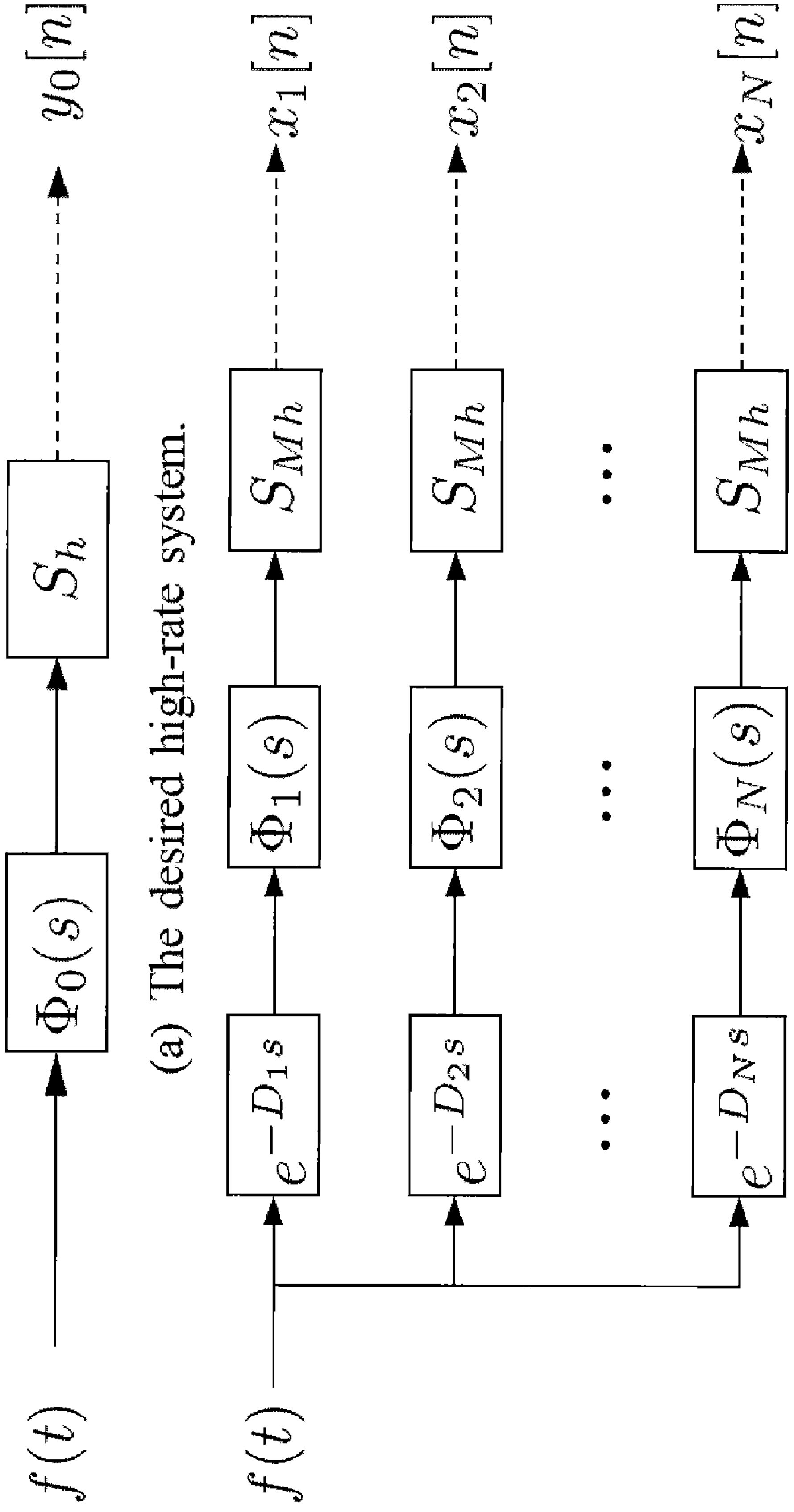

FIG. 4 shows a model of a fast analog-to-digital (A/D) converter used to obtain a desired high-resolution signal. An analog input signal f(t) is convolved with an antialiasing filter $\phi_0(t)$ (also known as the sampling kernel function) whose Laplace transform is $\phi_0(s)$. The output of the convolution is then sampled at small sampling interval h. The desired high-resolution signal is denoted by $y_0[n]=(f*\phi_0)(nh)$ for $n\in\mathbb{Z}$.

FIG. 4 also depicts how actual low-resolution signals $\{x_i[n]\}_{i=1}^N$ are sampled using slow A/D converters. The same analog input f(t) is sampled in parallel using N slow A/D converters. In the i-th channel, for $1\leqq i\leqq N$, the input f(t) is first convolved with a function $\phi_i(t)$ (with Laplace transform $\phi_i(s)$) before being delayed by $D_i>0$ (to compensate for different time arrivals). The low-rate signals $x_i[n]=(f*\phi_i)(nMh-D_i)$, for $n\in\mathbb{Z}$, can be used to synthesize the high-resolution signal $y_0[n]$ of FIG. 4.

An N-input M-output digital system F(z) may be designed, see FIG. 5, that synthesizes the high-resolution signal $y_0[n]$ using low-resolution signals $\{x_i[n]\}_{i=1}^N$. FIG. 5 illustrates an approximation of a high-resolution signal from low-resolution signals using an N-input M-output digital system F(z) and interleaving its outputs. This polyphase structure may be used for its efficiency and its ability to use low-rate computation.

This implementation can be done in parallel in the same clock speed of slow A/D converters; the high-rate output may be obtained at the final step by interleaving samples (also known as a polyphase transform, described in P. P. Vaidyanathan, *Multirate Systems and Filter Banks*, New York, N.Y., Prentice Hall, 1993 and M. Vetterli and J. Kovačević, *Wavelets and Subband Coding*, New York, N.Y., Prentice-Hall, 1995, both of which are incorporated herein by reference). More specifically, errors of a hybrid induced error system $\mathcal{K}$ shown in FIG. 3 may be minimized (using a criterion defined below), where $\{F_i(z)\}_{i=1}^N$ are equivalent synthesis filters such that their M×N polyphase matrix is F(z) of FIG. 2:

$$[F_1(z)F_2(z)\ldots F_N(z)]=[1z^{-1}\ldots z^{-M+1}]F(z^M) \quad (1)$$

Note that the high-rate signal $y_0[n]$ may be approximated with a delay of $m_0$ samples. Among components of $\mathcal{K}$, the transfer functions $\{\Phi(s)\}_{i=0}^N$ characterize antialiasing filters, and delays $\{D_i\}_{i=1}^N$ model system setup such as arrival times or sampling positions. Through construction and calibration, information about the sampling kernel functions $\{\Phi(s)\}_{i=0}^N$ and delays $\{D_i\}_{i=1}^N$ may be available. In such case, a corresponding optimal synthesis polyphase matrix F(z), or equivalently a filter bank $\{F_i(z)\}_{i=1}^N$ may be designed so that the resulting system depicted in FIG. 6 can be subsequently put in operation for arbitrary input signals f(t).

Figure 6:
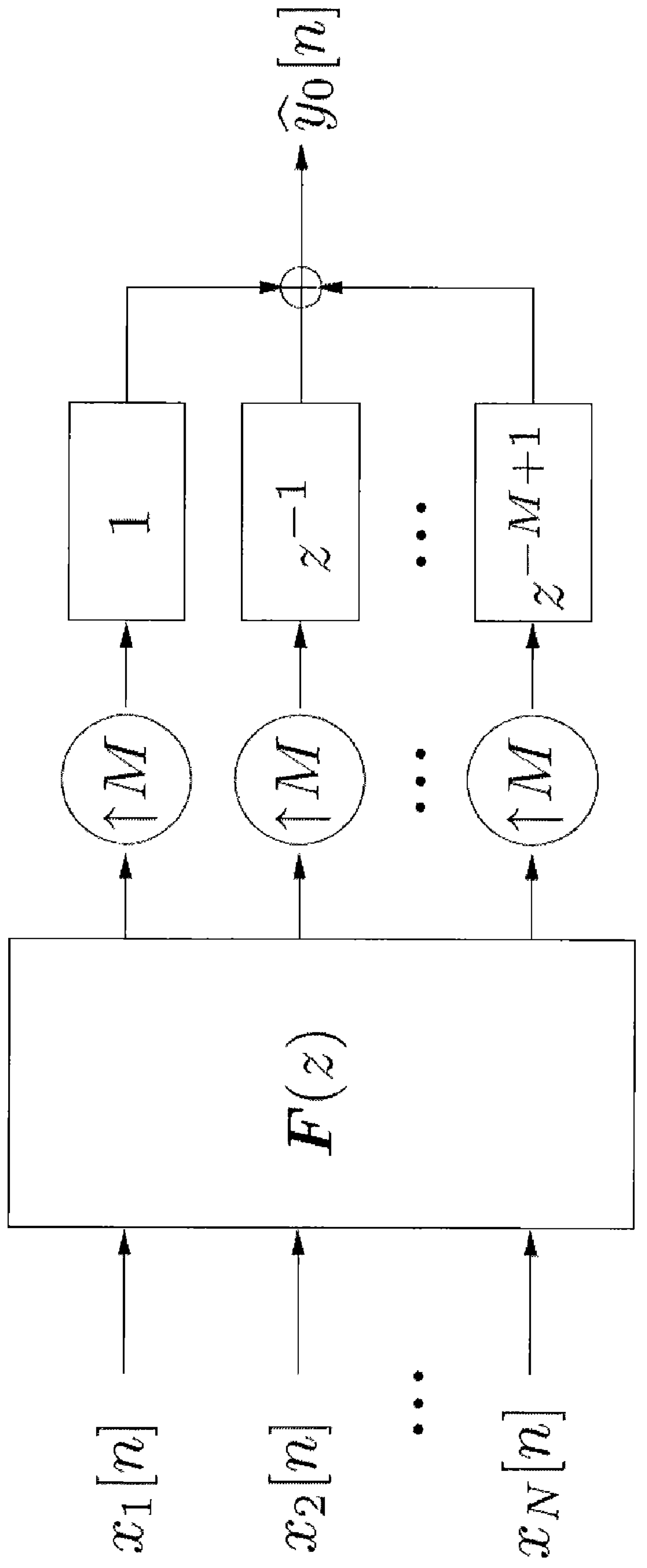
FIG. 6 illustrates an error determination system in accordance with an embodiment of the present disclosure.
Figure 6:
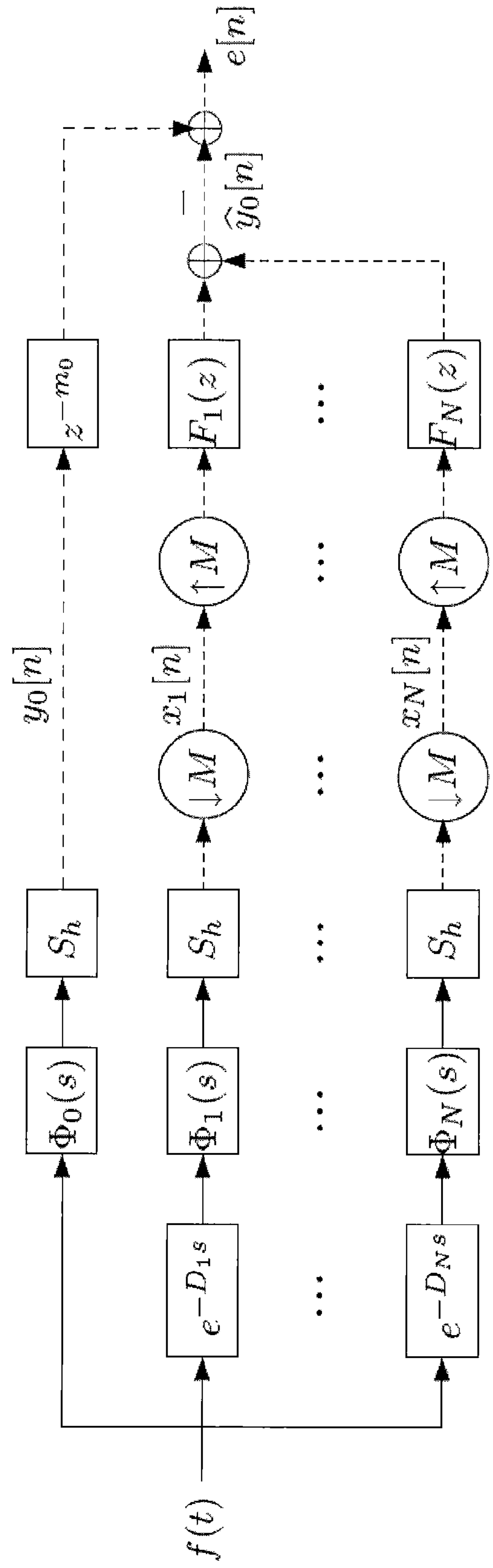

FIG. 6 illustrates a hybrid induced error system $\mathcal{K}$ with analog input f(t) and digital output e[n]. Synthesis filters $\{F_i(z)\}_{i=1}^N$ may be designed based on the transfer function $\{\phi(s)\}_{i=0}^N$, the fractional delays $\{D_i\}_{i=1}^N$, the system delay tolerance $m_0$, the sampling interval h, and the super-resolution rate M to minimize the $\mathcal{H}_\infty$ norm of the induced error system $\mathcal{K}$. The synthesis filter bank is shown here in parallel structure with filters $\{F_i(z)\}_{i=1}^N$ for symmetry. In some embodiments, it may be more efficient to use a polyphase structure with F(z) as shown in FIG. 5.

A special case of this multichannel sampling setup is called time-interleaved A/D converters where $\phi_i(s)=\phi_0(s)$ and $D_i=ih$ for i=1, 2, . . . , N. Then the synthesis filter bank can simply interleave samples, i.e. $F_i(z)=z^i$. Multichannel sampling extends time-interleaved A/D converters by allowing mismatch in sampling kernels before slow A/D converters (see J. Franca, A. Petraglia, and S. K. Mitra, "Multirate analog-digital systems for signal processing and conversion," in *Proc. IEEE*, vol. 35, no. 2 Feb. 1997, pp. 242-262, which is incorporated herein by reference). Moreover, in many cases, the time delays $\{D_i\}_{i=1}^N$, although they can be measured, (see J. Benesty, J. Chen, and Y. Huang, "Time-delay estimation via linear interpolation and cross correlation," *IEEE Trans. Speech Audio Proc.*, vol. 12, no. 5, pp. 509-519, September 2004; O. S. Jahromi and P. Aarabi. "Theory and design of multirate sensor arrays," *IEEE Trans. Signal Proc.*, vol. 53, no. 5, May 2005; C. H. Knapp and G. C. Carter, "The generalized correlation method for estimation of time delay," *IEEE Trans. Acoust., Speech, and Signal Proc.*, vol. ASSP-24, no. 4, pp. 320-327, August 1976; and, F. Viola and W. F. Walker, "A spline-based algorithm for continuous time-delay estimation using sampled data," *IEEE Trans. Ultrasonics, Ferroelectrics, and Frequency Control*, vol. 52, no. 1, pp. 80-93, January 2005, all of which are incorporated herein by reference), they cannot be controlled. Under these conditions, the multichannel sampling setup may be applied.

Many practical systems, such as electrical, mechanical, and electromechanical systems, can be modeled by differential equations (see B. P. Lathi, *Linear Systems and Signals, 2nd* ed. New York, N.Y., Oxford University Press, 1992, which is incorporated herein by reference). Their Laplace transforms are thus rational functions of form A(s)/B(s) for some polynomials A(s) and B(s). In the contrary, fractional delay operators $e^{-D_i s}$ are never rational if $D_i \neq 0$, though when $D_i$ is an integer multiple of h, operator $e^{-D_i s}$ can be pushed after the sampling operator $S_h$ to become an integer delay (in the digital domain). Working with fractional delay operators $e^{-D_i s}$ is necessary, though nontrivial, to keep intersample behaviors of the input signals.

Problem formulation. Consider the hybrid system $\mathcal{K}$ illustrated in FIG. 6. The $\mathcal{H}_\infty$ norm of $\mathcal{K}$ may be defined as $$\|\mathcal{K}\|_\infty := f \in L^2, f \neq 0 \left\{ \frac{\|e\|_2}{\|f\|_2} \right\}, \qquad (2)$$

where $\|e\|_2$ is the $l_2$ norm of e[n] and $\|f\|_2$ is the $L_2$ norm of f(t). Synthesis filters (e.g. IIR or FIR filters) $\{F_i(z)\}_{i=1}^N$ may be designed to minimize $\|\mathcal{K}\|_\infty$. The inputs of these algorithms consist of the strictly proper transfer functions $\{\phi_i(s)\}_{i=0}^N$, the positive fractional delays $\{D_i\}_{i=1}^N$ the system delay tolerance $m_0 \geqq 0$, the sampling interval h>0, and the upsampling-rate $M \geqq 2$.

In the design of the synthesis filter $\{F_i(z)\}_{i=1}^N$ system performance may be evaluated using the $\mathcal{H}_\infty$ approach (see B. Francis, *A Course in $\mathcal{H}_\infty$ Control Theory*, Heidelberg, Germany, Springer-Verlag, 1987; M. Green and D. J. N. Limebeer, *Linear Robust Control*, Upper Saddle River, N.J., Prentice-Hall, Inc., 1995; and, H. Shu, T. Chen, and B. Francis, "Minimax design of hybrid multirate filter banks," *IEEE Trans. Circ. and Syst.*, vol. 44, no. 2, February 1997, all of which are incorporated herein by reference). In the digital-domain the Hardy space $\mathcal{H}_\infty$, which consists of all complex-value transfer matrices G(z) which are analytic and bounded outside of the unit circle |z|>1 can be used. Hence $\mathcal{H}_\infty$ is the space of transfer matrices that are stable in the bounded-input bounded-output sense. The $\mathcal{H}_\infty$ norm of G(z) is defined as the maximum gain of the corresponding system. If a system G, analog or digital, has input u and output y, the $\mathcal{H}_\infty$ norm of G is $$\|G\|_\infty = sup\{\|y\|_2 : y = Gu, \|u\|_2 = 1\}, \qquad (3)$$

where the norms are regular Euclidean norm ||•||; that is, $$\|x\|_2 = \left( \sum_{n=-\infty}^{\infty} \|x[n]\|^2 \right)^{1/2}$$

for digital signals x[n], and $$\|x\|_2 = \left( \int_{-\infty}^{\infty} \|x(t)\|^2 \, dt \right)^{1/2}$$

for analog signals x(t).

The use of $\mathcal{H}_\infty$ optimization framework, originally proposed by Shenoy et al. (described in R. G. Shenoy, D. Burnside, and T. W. Parks, "Linear periodic systems and multirate filter design", *IEEE Trans. Signal Proc.*, vol. 42, no. 9, pp. 2242-2256, September 1994, which is incorporated herein by reference), for filter bank designs, offers powerful tools for signal processing problems. Using the $\mathcal{H}_\infty$ optimization framework, the induced error is uniformly small over all finite energy inputs $f(t) \in \mathcal{L}(\mathbb{R})$ (i.e., $\|f(t)\|_2 < \infty$). Furthermore, no assumptions of f(t), such as band-limitedness, are necessary. The worst induced error over all finite energy inputs f(t) may be minimized since many practical signals are not bandlimited such as images with discontinuities at edges (see D. Slepian, "On bandwidth," in *Proc. IEEE*, vol. 64, no. 3, 1976 pp. 292-300, which is incorporated herein by reference). Since $\mathcal{H}_\infty$ optimization is performed in the Hardy space, the designed filters may be stable.

Sampled-data control techniques may be used to convert the design problem for $\mathcal{K}$ into a $\mathcal{H}_\infty$ norm equivalent finite-dimensional model-matching problem. The conversion may enable the design synthesis filters, IIR or FIR, to minimize the $\mathcal{H}_\infty$ norm of $\mathcal{K}$. . The norm equivalence property reduces the induced errors compared to methods that approximate the fractional delays by IIR or FIR filters (see J. Lam, "Model reduction of delay systems using Pade approximation," *International Journal of Control*, vol. 57, no. 2, pp. 377-391, February 1993; L. D. Philipp, A. Mahmood, and B. L. Philipp, "An improved refinable rational approximation to the ideal time delay," *IEEE Trans. Circ. and Syst.*, vol. 46, no. 5, pp.

637-640, May 1999; M. G. Yoon and B. H. Lee, "A new approximation method for time-delay systems," *IEEE Trans. Autom. Control*, vol. 42, no. 7, pp. 1008-1012, July 1997; and T. I. Laakso, V. Valimaki, M. Karjalainen, and U. K. Laine, "Splitting the unit delay—tools for fractional delay filter design," *IEEE Signal Proc. Mag*., vol. 13, no. 1, pp. 30-60, 1996, all of which are incorporated herein by reference). IIR synthesis filters are designed using available solutions to the model-matching problem. To design FIR filters, linear matrix inequality (LMI) methods (see as described in V. Balakrishnan and L. Vandenberghe, "Linear matrix inequalities for signal processing: An overview," in *Proceedings of the* 32*nd Annual Conference on Information Sciences and Systems*, Princeton, N.J., March 1998; and S. Boyd, L. El Ghaoui, E. Feron, and V. Balakrishnan, *Linear Matrix Inequalities in System and Control Theory*, ser. Studies in Applied Mathematics, Philadelphia, Pa.: SIAM Journ. of Math. Anal., 1994, both of which are incorporated herein by reference), may be used. Although FIR filter designs using LMI methods have been proposed for other problems (see Y. Yamamoto, B. D. O. Anderson, M. Nagahara, and Y. Koyanagi, "Optimal FIR approximation for discrete-time IIR filters," *IEEE Signal Proc. Letters*, vol. 10, no. 9, pp. 273-276, September 2003; M. Nagahara and Y. Yamamoto, "Optimal design of fractional delay filters," *IEEE Conference on Decision and Control*, vol. 6, pp. 6539-6544, December 2003; and "Optimal design of fractional delay FIR filters without bandlimiting assumption," *Proc. IEEE Int. Conf. Acoust., Speech, and Signal Proc*., vol. 4, pp. 221-224, March 2005, all of which are incorporated herein by reference), only IIR filter designs are proposed for related problems (see H. T. Nguyen and M. N. Do, "Signal reconstruction from a periodic nonuniform set of samples using $\mathcal{H}_\infty$ optimization," in *Proc. of SPIE*, vol. 6498, San Jose, February 2007; O. S. Jahromi and P. Aarabi, "Theory and design of multirate sensor arrays," *IEEE Trans. Signal Proc*., vol. 53, no. 5, May 2005; H. Shu, T. Chen, and B. Francis, "Minimax design of hybrid multirate filter banks," *IEEE Trans. Circ. and Syst*., vol. 44, no. 2, February 1997; and, T. Chen and B. Francis, "Design of multirate filter banks by $\mathcal{H}_\infty$ optimization," *IEEE Trans. Signal Proc*., vol. 43, no. 12, pp. 2822-2830, December 1995, all of which are incorporated herein by reference).

Herein, an (analog or digital) single-input single-output transfer function G is written in regular font, an (analog or digital) multi-input and/or multi-output G is written in bold, and a hybrid system $\mathcal{G}$ is written in calligraphic font. The notation $$G = \left[\begin{array}{c|c} A & B \\ \hline C & B \end{array}\right] \text{ or } G = \{A, B, C, D\} \tag{4}$$

is used to denote a state-space representation of a system G, that is $G(s)=D+C(sI-A)^{-1}B$ for an analog system or $G(z)=D+C(zI-A)^{-1}B$ for a digital system. Scalars are written in regular font as x, and vectors in bold as x. In the figures, solid lines illustrate analog signals, and dashed lines are intended for digital ones. $S_h$ is denoted for the sampling operator by h; i.e.

$$S_h\{v(t)\}[n]=v(nh).$$

Equivalence of $\mathcal{K}$ to a Model-Matching Problem

In this section, it is shown that there exists a finite-dimensional digital linear time-invariant system K that has the same $\mathcal{H}_\infty$ norm with $\mathcal{K}$. . This is demonstrated in three steps. In Section II-A, $\mathcal{K}$ is converted into an infinite-dimensional digital system. Next, in Section II-B, the system is further converted into a finite-dimensional system $K_d$. Finally, in Section II-C, $K_d$ is converted into a linear time-invariant system.

Equivalence of $\mathcal{K}$ to a Digital System

Figure 7:
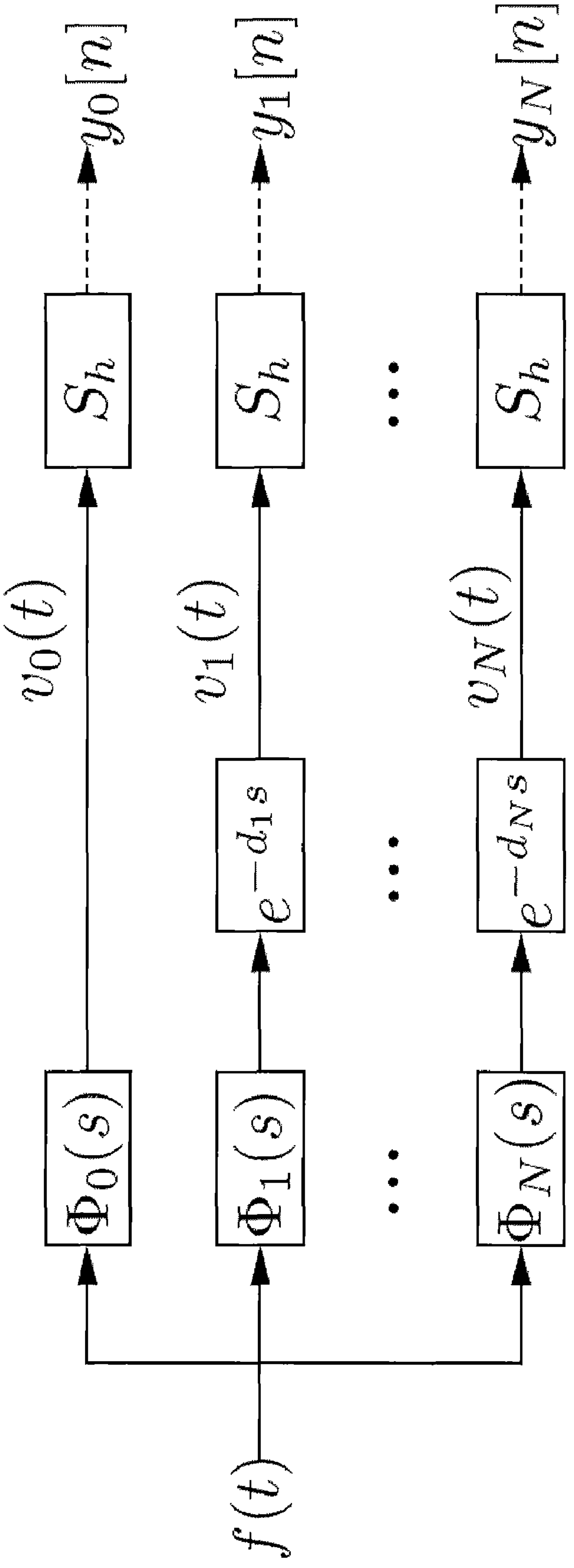
FIG. 7 illustrates an analog input, digital output system in accordance with an embodiment of the present disclosure.

It may be shown that the hybrid subsystem $\mathcal{G}$ (see FIG. 7) of $\mathcal{K}$ is $\mathcal{H}_\infty$ norm equivalent to a digital system. In FIG. 7, $\{d_i\}_{i=1}^N$ is denoted as the fractional parts of $\{D_i\}_{i=1}^N$. In other words, $0 \leqq d_i < h$ and $m_i \in \mathbb{Z}$ such that $$D_i=m_ih+d_i (1 \leqq i \leqq N). \tag{5}$$

In the mathematical derivation, $m_i$, and hence $D_i$, for $1 \leqq i \leqq N$, can be negative, though in many practical applications, $D_i$ are strictly greater than zero. In working with system $\mathcal{G}$, compensation is needed for the difference between $e^{-D_is}$ and $e^{-d_is}$. These differences are analog delay operators $e^{-m_ihs}$ that can be interchanged with the sampling operators $S_h$ to produce digital integer delay operators $z^{-m_i}$.

Each channel of $\mathcal{G}$ will be shown to be $\mathcal{H}_\infty$ norm equivalent to a digital system. Since $\phi_0(s)$ is strictly proper, there exist state-space matrices $\{A_0,B_0,C_0,0\}$ and state function $x_0(t)$ such that $$\begin{cases} \dot{x}_0(t) = A_0x_0(t) + B_0f(t) \\ v_0(t) = C_0x_0(t). \end{cases}$$

For $0 \leqq t_1 < t_2 < \infty$, compute the future state value $x_0(t_2)$ from a previous state value $x_0(t_1)$ as follows:

$$x_0(t_2) = e^{(t_2-t_1)A_0}x_0(t_1) + \int_{t_1}^{t_2} e^{(t_2-\tau)A_0}B_0f(\tau)d\tau. \tag{6}$$

Define linear operator $Q_0$ taking inputs $u(t) \in \mathcal{L}_2$ [0,h) as $$Q_0u = \int_0^h e^{(h-\tau)A_0}B_0u(\tau)d\tau. \tag{7}$$

Apply (6) using $t_1=nh$ and $t_2=(n+1)h$ to get $$x_0((n+1)h)=e^{hA_0}x_0(nh)+Q_0\tilde{f}[n], \tag{8}$$

where $\tilde{f}[n]$ denotes the portion of f(t) on the interval [nh, nh+h) translated to [0,h). In other words, consider the analog signal f(t) as a sequence $\{\tilde{f}[n]\}_{n\in\mathbb{Z}}$ with $\tilde{f}[n] \in \mathcal{L}_2$ [0,h). The mapping from f(t) into $\{\tilde{f}[n]\}_{n\in\mathbb{Z}}$ is called the lifting operator [5, Section 10.1]. Clearly, the lifting operator preserves the energy of the signals, that is, $$\|f(t)\|_2 = \|\tilde{f}\|_2 = \left(\sum_{n=-\infty}^{\infty} \|\tilde{f}[n]\|_2^2\right)^{1/2},$$

where $$\|\tilde{f}[n]\|_2^2 := \int_{nh}^{(n+1)h} |f(t)|^2 dt.$$

Let $\mathcal{G}_0$ be the hybrid subsystem of $\mathcal{G}$ with input f(t) and output $y_0[n]$ (see FIG. 7). An implication of (8) is that $y_0[n]$ $=v_0(nh)$ can be considered as the output of a digital system with input $\tilde{f}[n]$ and state $x_{d0}[n]=x_0(nh)$ as follows:

$$\begin{cases} x_{d0}[n+1] = e^{hA_0}x_{d0}[n] + Q_0 + \tilde{f}[n] \\ y_0[n] = C_0 x_{d0}[n]. \end{cases}$$

Since the lifting operator preserves the norm, system $\mathcal{G}_0$ s $\mathcal{H}_\infty$ norm equivalent to the system $G_0=\{e^{hA_0}, Q_0, C_0, 0\}$.

The same technique can be used for the remaining channels. Let $\mathcal{G}_i$ for $1 \leqq i \leqq N$, be the hybrid subsystem of $\mathcal{G}$ with input f(t) and output $y_i[n]$ (see FIG. 7). Suppose that $\{A_i, B_i, C_i, 0\}$ is a state-space realization of $\phi_i(s)$ with state function $x_i(t)$. Linear operators $Q_i$ and $R_i$ taking inputs $u(t) \in \mathcal{L}_2$ [0,h) may be defined as $$Q_i u = \int_0^h e^{(h-\tau)A_i} B_i u(\tau)\, d\tau, \tag{9}$$

and $$R_i u = C_i \int_0^{h-d_i} e^{(h-d_i-\tau)A_i} B_i u(\tau)\, d\tau. \tag{10}$$

Similar to (8), $$x_i((n+1)h) = e^{hA_i} x_i(nh) + Q_i \tilde{f}[n]. \tag{11}$$

may be obtained.

Apply (6) again with $t_1=nh$ and $t_2=(n+1)h-d_i$ to get $$x_i((n+1)h-d_i) = e^{(h-d_i)A_i} x_i(nh) + + \int_{nh}^{(n+1)h-d_i} e^{((n+1)h-d_i-\tau)A_i} B_i f(\tau) d\tau.$$

Since $v_i(t)=C_i x_i(t-d_i)$ for all t, using $t=(n+1)h$ it follows that $$v_i((n+1)h) = C_i e^{(h-d_i)A_i} x_i(nh) + R_i \tilde{f}[n]. \tag{12}$$

(11) and (12) show that $y_i[n]=v_i(nh)$ can be considered as the output of a digital system with input $\tilde{f}[n]$ and state $$x_{di}[n] = \begin{bmatrix} x_i(nh) \\ v_i(nh) \end{bmatrix}$$

as follows:

$$\begin{cases} x_{di}[n+1] = \underbrace{\begin{bmatrix} e^{hA_i} & 0 \\ C_i e^{(h-d_i)A_i} & 0 \end{bmatrix}}_{A_{di}} x_{di}[n] + \underbrace{\begin{bmatrix} Q_i \\ R_i \end{bmatrix}}_{B_i} \tilde{f}[n] \\ y_i[n] = \underbrace{[0,\ 1]}_{C_{di}} x_{di}[n]. \end{cases} \tag{13}$$

Since the lifting operator preserves the norm, system $\mathcal{G}_i$ is $\mathcal{H}_\infty$ norm equivalent to the system $G_i=(A_{di}, B_i, C_{di}, 0)$.

Finally, note that the system $\mathcal{G}$ is the vertical concatenation of subsystems $\{\mathcal{G}_i\}_{i=0}^N$. Since each subsystem $\mathcal{G}_i$ is $\mathcal{H}_\infty$ norm equivalent to the system $G_i$ with the same input $\tilde{f}[n]$, for $0 \leqq i \leqq N$, the system $\mathcal{G}$ is also $\mathcal{H}_\infty$ norm equivalent to the vertical concatenation system G of subsystems $\{G_i\}_{i=0}^N$. The result of this section is summarized in Proposition 1.

Proposition 1: The system $\mathcal{G}$ is $\mathcal{H}_\infty$ norm equivalent to the infinite-dimensional digital system $$G = \left[\begin{array}{c|c} A_d & B \\ \hline C_d & 0 \end{array}\right], \tag{14}$$

where $A_d$, B, $C_d$ are determined as $$\begin{cases} A_d = diag_{N+1}(e^{hA_0}, A_{d1}, \ldots, A_{dN}) \\ B = [\,Q_0^T \;\; B_1^T \;\; \ldots \;\; B_N^T\,]^T \\ C_d = diag_{N+1}(C_0, [0,1], \ldots, [0,1]). \end{cases} \tag{15}$$

In the above equations, and in the remainder of the paper, $diag_k(\alpha_1, \alpha_2, \ldots, \alpha_k)$ is the matrix with $\alpha_i$ in the diagonal, for $1 \leqq i \leqq k$, and 0 elsewhere, where $\{\alpha_i\}_{i=1}^k$ can be scalars, vectors, or matrices.

Equivalence of $\mathcal{K}$ to a Finite Dimensional Digital System

Proposition 1 shows that $\mathcal{G}$ is $\mathcal{H}_\infty$ norm equivalent to an infinite-dimensional digital system G. Next, convert G further into some finite-dimensional digital system $G_d$.

Proposition 2: Let $B^*$ be the adjoint operator of B and $B_d$ be a square matrix such that $$B_d B_d^T = BB^*. \tag{16}$$

The finite-dimensional digital system $G_d(z) \Leftrightarrow \{A_d, B_d, C_d, 0\}$ has the same $\mathcal{H}_\infty$ norm with $\mathcal{G}$:

$$\|G_d\|_\infty = \|\mathcal{G}\|_\infty. \tag{17}$$

Proof: The product $BB^*$ is a linear operator characterized by a square matrix of finite dimension. The adjoint operators of $\{Q_i\}_{i=0}^N$ and $\{R_i\}_{i=1}^N$ are:

$$(Q_i^* x)(t) = B_i^T e^{(h-t)A_i^T} x \tag{46}$$

$$(R_i^* x)(t) = 1_{[0,h-d_i)} B_i^T e^{(h-d_i-t)A_i^T} C_i^T x. \tag{47}$$

Hence, the adjoint operator of $B_i$ is $B_i^*=[Q_i^*, R_i^*]$ and the adjoint operator of B is $B^*=[Q_0^*, B_1^*, \ldots, B_N^*]$. Lemma 2 provides a formula to compute the product $BB^*$.

Lemma 2: The operator $BB^*$ is a linear operator characterized by a symmetric matrix $\Delta=(\Delta_{ij})_{i,j=0}^N$ with:

$$\Delta_{ij} = \begin{cases} \begin{matrix} Q_0 Q_0^*, \\ Q_0 B_j^* \end{matrix} = [\,Q_0 Q_j^* \;\; Q_0 R_j^*\,], & \begin{matrix} \text{if } i=j=0 \\ \text{if } 0=i<j \end{matrix} \\ B_i B_j^* = \begin{bmatrix} Q_i Q_j^* & Q_i R_j^* \\ R_i Q_j^* & R_i R_j^* \end{bmatrix}, & \text{if } 0<i\le j \\ \Delta_{ji}^T, & \text{if } i>j \end{cases}$$

Each block $\Delta_{ij}$ is composed by components of forms $Q_i Q_j^*$, $Q_i R_j^*$ and $R_i R_j^*$ that can be computed as:

$$Q_i Q_j^* = M_{ij}(h) \tag{48}$$

$$Q_i R_j^* = e^{d_j A_j} M_{ij}(h-d_j) C_j^T \tag{49}$$

$$R_i R_j^* = \begin{cases} C_i e^{(d_j-d_i)A_i} M_{ij}(h-d_j) C_j^T, & \text{if } d_i < d_j \\ C_i M_{ij}(h-d_i) e^{(d_i-d_j)A_j^T} C_j^T, & \text{if } d_i \ge d_j \end{cases} \tag{50}$$

where $$M_{ij}(t) := \int_0^t e^{\tau A_i} B_i B_j^T e^{\tau A_j^T} d\tau. \tag{51}$$

Proof: The proof of (50) is shown here. The proof of (48) and (49) are similar. Consider the case $d_i<d_j$. For any x of appropriate dimension:

$$(R_iR_j^*)x = C_i\int_0^{h-d_i} e^{(h-d_i-\tau)A_i}B_i(R_j^*x)(\tau)d\tau = \left(C_i e^{(d_j-d_i)A_i}M_{ij}(h-d_j)C_j^T\right)x.$$

Hence, if $d_i<d_j$:

$$R_iR^*_j=C_ie^{(d_j-d_i)A_i}M_{ij}(h-d_j)C_j^T$$

The proof is similar for the case where $d_i \geqq d_j$.

Finally, note that $M_{ij}(t)$ can be efficiently computed as (see C. F. V. Loan, "Computing integrals involving the matrix exponential," *IEEE Trans. Autom. Control*, vol. 23, no. 3, pp. 395-404, June 1978, which is incorporated herein by reference):

$$M_{ij}(t)=e^{A_it}\pi_{12}(t),$$

where $\pi_{12}(t)$ is the block (1,2) of the matrix:

$$\begin{bmatrix} \pi_{11}(t) & \pi_{12}(t) \\ 0 & \pi_{22}(t) \end{bmatrix} = \exp\left(\begin{bmatrix} -A_i & B_iB_j^T \\ 0 & A_j^T \end{bmatrix} t\right)$$

Hence $G_d(z)\Leftrightarrow\{A_d,B_d,C_d,0\}$ is a finite-dimensional digital system. The proof of (17) can be found in [5, Section 10.5].

Proposition 2 claims that, for all analog signals f(t), there exists a digital signal u[n] having the same energy as f(t) such that $[y_0, \ldots, y_N]^T=G_du$. The dimension $n_u$ of u[n] is equal to the number of rows of $A_d$ (see Proposition 1), i.e., $$n_u=n_0+n_1+\ldots+n_N+N, \quad (18)$$

where $n_i$ is the number of rows of $A_i$, for $0\leqq i\leqq N$. In order to minimize the worst induced error over all inputs f(t) of finite energy, minimize $\|G_d\|_\infty$ for all inputs u[n] (having the same energy with f(t)).

Take into account the integer delay operators $\{z^{-m_i}\}_{i=0}^N$ to obtain a digital system $K_d$ that has the same $\mathcal{H}_\infty$ norm as $\mathcal{K}$.

Proposition 3: Let $C_{di}$ be the i-th row of the (N+1)-row matrix $C_d$ (see Proposition 1), and $H_i(z)$ be the multi-input single-output rational function that outputs $y_i[n]$ from input u[n], for $0\leqq i\leqq N$. The system $H_i(z)$ can be computed as $$H_i(z) = z^{-m_i}\left[\begin{array}{c|c} A_d & B_d \\ \hline C_{di} & 0 \end{array}\right] \quad (0 \le i \le N). \quad (19)$$

Figure 8:
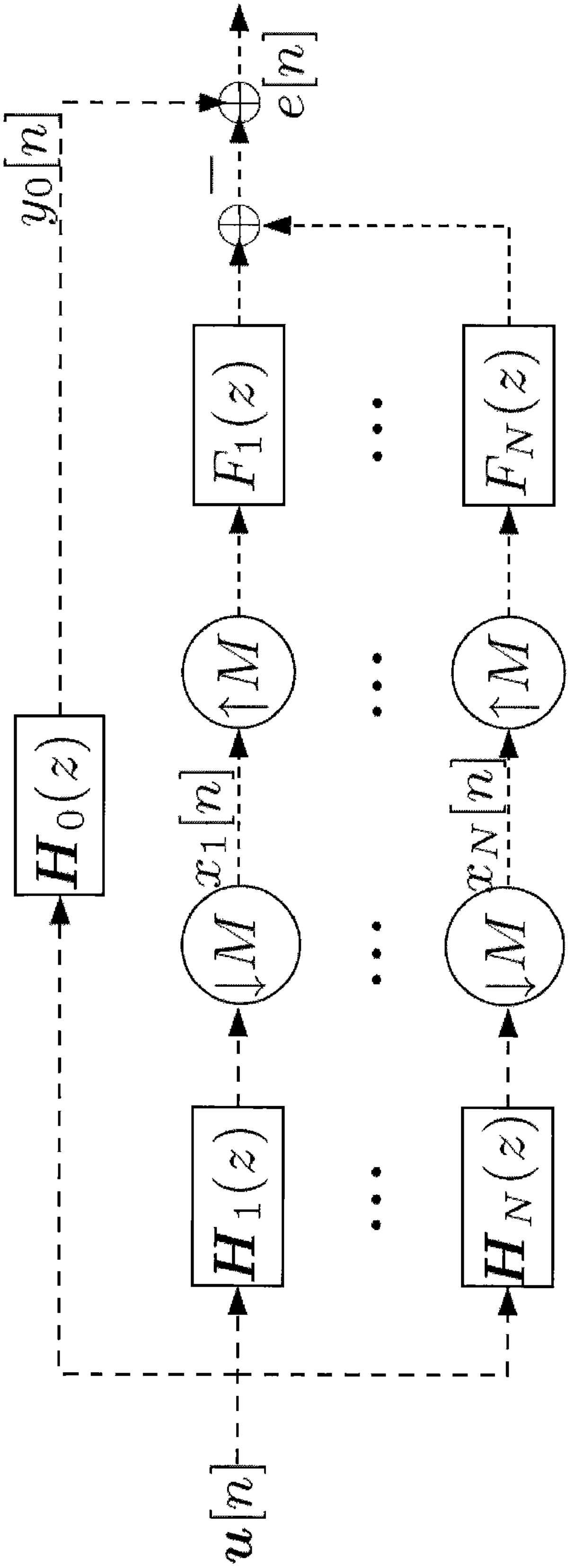
FIG. 8 illustrates an $\mathcal{H}_\infty$ norm equivalent digital system in accordance with an embodiment of the present disclosure.

As a result, system $\mathcal{K}$ is equivalent to the multiple-input one-output digital system $K_d(z)$ illustrated in FIG. 8. FIG. 8 illustrates the $\mathcal{H}_\infty$ norm equivalent digital system $K_d$ of $\mathcal{K}$. Here $\{H_i(z)\}_{i=0}^N$ are rational transfer functions defined in (19). Note that input u[n] is of $n_u$ dimension.

Equivalence of $\mathcal{K}$ to a Linear Time Invariant System

The finite-dimensional digital system $K_d$ is not linear time-invariant (LTI) because of the presence of upsampling and downsampling operators (↑M), (↓M). Apply polyphase techniques (see P. P. Vaidyanathan, *Multirate Systems and Filter Banks*, New York, N.Y., Prentice Hall, 1993; and, M. Vetterli and J. Kovacevî c, *Wavelets and Subband Coding*, New York, N.Y., Prentice-Hall, 1995, both of which are incorporated herein by reference), to make $K_d$ an LTI system.

Let $H_{0,j}(z)$, for $0\leqq j\leqq M-1$, be the polyphase components of filter $H_0(z)$. In other words, $$H_0(z) = \sum_{j=0}^{M-1} z^j H_{0,j}(z^M). \quad (20)$$

Also denote $u_p[n]$ and $e_p[n]$ the polyphase versions of u[n] and e[n]. Note that $\|u_p\|_2=\|u\|_2$ and $\|e_p\|_2=\|e\|_2$. Hence, by working in the polyphase domain, $K_d(z)$ is converted into an LTI system with the same $\mathcal{H}_\infty$ norm.

Proposition 4: The digital error system $K_d(z)$ is equivalent to the LTI system $$K(z)=W(z)-H(z)F(z) \quad (21)$$

with input $u_p[n]$ and output $e_p[n]$. In (21), H(z) and F(z) are standard polyphase matrices of $\{H_i(z)\}_{i=1}^N$ and $\{F_i(z)\}_{i=1}^N$, and $$(W(z))_{i,j} = \begin{cases} H_{0,j-i}(z) & \text{if } 1 \le i \le j \le M \\ zH_{0,M+j-i}(z) & \text{if } 1 \le j < i \le M. \end{cases} \quad (22)$$

Proof: The proof uses standard polyphase techniques, hence omitted here.

Figure 9:
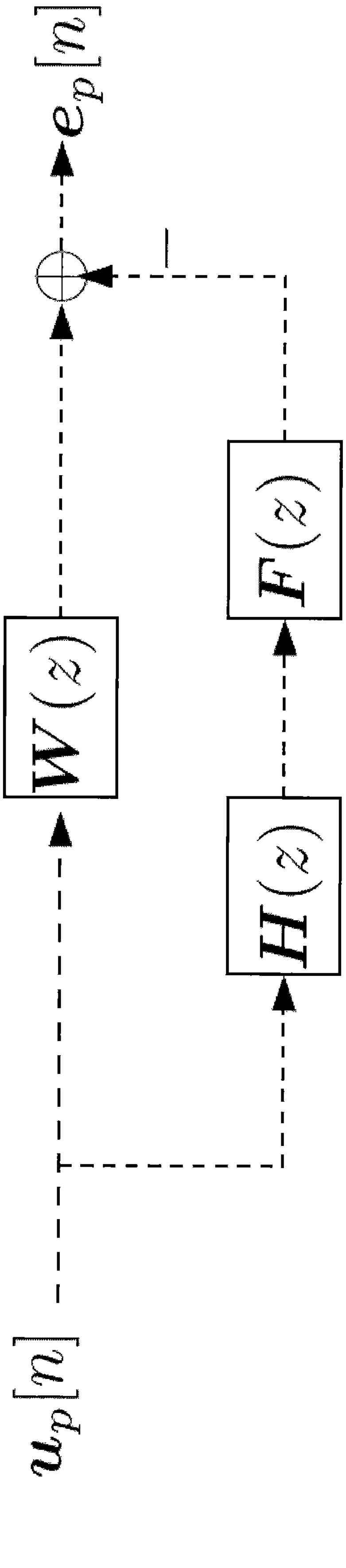
FIG. 9 illustrates a linear time invariant error system in accordance with an embodiment of the present disclosure.

FIG. 9 shows the equivalent digital, LTI error system K(z). Note that the system K(z) is $Mn_u$ input, M output, the transfer matrices W(z), H(z) are of dimension $M\times Mn_u$ and F(z) is of dimension M×M. The transfer function matrix F(z) is to be designed. State-space realizations of H(z) and W(z) are given in Theorem 1 using state-space realizations $\{A_{H_i},B_{H_i},C_{H_i},0\}$ of $\{H_i(Z)\}_{i=0}^N$ (it can be easily verified that the D-matrix of $H_i(z)$ is a zero-matrix).

Theorem 1: The original induced error system $\mathcal{K}$ has an $\mathcal{H}_\infty$ norm equivalent digital, LTI system K(z)=W(z)−F(z)H(z) (see FIG. 9); that is, $$\|\mathcal{K}\|_\infty=\|W(z)-F(z)H(z)\|_\infty, \quad (23)$$

where F(z) is the polyphase matrix of $\{F_i(Z)\}_{i=1}^N$ to be designed. State-space realizations of W(z) and H(z) can be computed as follows:

$$\begin{aligned} A_W &= A_{H_0}^M \\ B_W &= \left[A_0^{M-1}B_{H_0}, A_{H_0}^{M-2}B_{H_0}, \ldots, B_{H_0}\right] \\ C_W &= \left[(C_{H_0})^T, (C_{H_0}A_{H_0})^T, \ldots, (C_{H_0}A_{H_0}^{M-1})^T\right]^T \\ (D_W)_{ij} &= \begin{cases} C_{H_0}A_{H_0}^{i-j-1} & \text{if } 1 \le j < i \le M \\ 0 & \text{else,} \end{cases} \end{aligned} \quad (24)$$

and $$\begin{aligned} A_H &= diag_N\left(A_{H_1}^M, \ldots, A_{H_1}^M\right) \\ (B_H)_{ij} &= A_{H_i}^{M-j}B_{H_i}, \quad \text{for } 1 \le i \le N, 1 \le j \le M \\ C_H &= diag_N(C_{H_1}, \ldots, C_{H_N}) \\ D_H &= 0. \end{aligned} \quad (25)$$

Proof: Here the proof for (24) is given. The proof for Eq. (25) can be derived similarly. Consider the transfer function $H_{00}(z)$ in the block (1,1) of W(z) (see Proposition 4):

$$H_{00}(z) = \sum_{i=1}^{\infty} C_{H_0} A_{H_0}^{iM-1} B_{H_0} z^{-i} = \sum_{i=1}^{\infty} C_{H_0} (A_{H_0}^{M})^{i-1} (A_{H_0}^{M-1} B_{H_0}) z^{-i} = \left[\begin{array}{c|c} A_{H_0}^{M} & A_{H_0}^{M-1} B_{H_0} \\ \hline C_{H_0} & 0 \end{array}\right]$$

The state-space representation of the block (1,1) of W(z) is in agreement with (24). The same technique can be applied for the remaining blocks.

Design of IIR Filters

Conversion to the Standard $\mathcal{H}_\infty$ Control Problem

The problem of designing F(z) to minimize $\|K\|_\infty$ (see FIG. 9) has a similar form to the model-matching form which is a special case of the standard problem in $\mathcal{H}_\infty$ control theory. FIG. 10 shows the system K(z) in the standard form. The system P(z) of FIG. 10 has a state-space realization derived from ones of W(z) and H(z) as $$\left[\begin{array}{c|c} A_P & B_P \\ \hline C_P & D_P \end{array}\right] = \left[\begin{array}{cc|cc} A_W & 0 & B_W & 0 \\ 0 & A_H & B_H & 0 \\ \hline C_W & 0 & D_W & -I \\ 0 & C_H & D_H & 0 \end{array}\right] \quad (26)$$

Solutions to the standard problem have existing software, such as MATLAB's Robust Control Toolbox (R. Y. Chiang and M. G. Safonov, "MATLAB—robust control toolbox," http://www.mathworks.com, 2005), to facilitate the optimization procedures.

Design Procedure

Inputs: Rational transfer functions $\{\Phi_i(s)\}_{i=0}^{N}$ (strictly proper), positive fractional delays $\{D_i(s)\}_{i=1}^{N}$, the system tolerance delay $m_0 \geqq 0$, the sampling interval h>0, the superresolution rate $M \geqq 2$.

Outputs: IIR synthesis filters $\{F_i(z)\}_{i=1}^{N}$ or equivalently polyphase matrix F(z).

1. Let $D_i = m_i h + d_i$ for $1 \leqq i \leqq N$ as in (5).
2. Compute a state-space realization $\{A_i, B_i, C_i, 0\}$ of $\Phi_i(s)$ for $0 \leqq i \leqq N$.
3. Compute the system $G_d = \{A_d, B_d, C_d, 0\}$ as in Proposition 1 and 2.
4. Compute a state-space realization of $H_i(z)$, for $0 \leqq i \leqq N$, as in Proposition 3.
5. Compute the state-space realization of W(z) and H(z) as in (24) and in (25) of Theorem 1.
6. Compute the state-space realization of P(z) from H(z) and W(z) as in (26).
7. Design a synthesis system F(z) using existing $\mathcal{H}_\infty$ optimization tools.

Design of FIR Filters

Conversion to a Linear Matrix Inequality Problem

In this section, a design procedure is presented to synthesize FIR filters $\{F_i(z)\}_{i=1}^{N}$. For some practical applications, FIR filters are preferred to IIR filters for their robustness to noise and computational advantages.

A state-space realization $\{A_F, B_F, C_F, D_F\}$ of the polyphase matrix F(z) of $\{F_i(z)\}_{i=1}^{N}$ based on the coefficients of $\{F_i(z)\}_{i=1}^{N}$ is derived. Assuming that the synthesis FIR filters $\{F_i(z)\}_{i=1}^{N}$ are of maximum length nM>0 for $1 \leqq i \leqq N$.

$$F_i(z) = d_{i0} + d_{i1} z^{-1} + d_{i2} z^{-2} + \ldots + d_{i,nM-1} z^{-nM+1},$$

and $$C_{ij} = [d_{i,j+M} d_{i,j+2M} \ldots d_{i,j+(n-1)M}],$$

The polyphase system F(z) of $\{F_i(z)\}_{i=1}^{N}$ has a state-space realization $\{A_F, B_F, C_F, D_F\}$ as $$\begin{cases} A_F = diag_M(A_n, \ldots, A_n) \\ B_F = diag_M(B_n, \ldots, B_n) \\ (C_F)_{ij} = C_{ji} (0 \le i \le M-1 \text{ and } 1 \le j \le N) \\ (D_F)_{ij} = d_{ji} (0 \le i \le M-1 \text{ and } 1 \le j \le N) \end{cases} \quad (27)$$

where matrix $A_n \in \mathbb{R}^{n \times n}$ and vector $B_n \in \mathbb{R}^n$ are $$A_n = \begin{bmatrix} 0 & \ldots & \ldots & 0 \\ 1 & \ddots & & \vdots \\ \vdots & \ddots & \ddots & \vdots \\ 0 & \ldots & 1 & 0 \end{bmatrix}, \quad B_n = \begin{bmatrix} 1 \\ 0 \\ \vdots \\ 0 \end{bmatrix}$$

Note that, given the number n, the matrices $A_F, B_F$ do not depend on $\{F_i(z)\}_{i=1}^{N}$. Hence, designing $\{F_i(z)\}_{i=1}^{N}$ is equivalent to finding the matrices $C_F, D_F$ to minimize K(z). The system K(z) has a state-space realization $\{A_K, B_K, C_K, D_K\}$ as follows:

$$K = \left[\begin{array}{ccc|c} A_W & 0 & 0 & B_W \\ 0 & A_H & 0 & B_H \\ 0 & B_F C_H & A_F & B_F D_H \\ \hline C_W & -D_F C_H & -C_F & D_W - D_F D_H \end{array}\right] \quad (28)$$

It is observed that the state-space matrices of K(z) depend on $C_F, D_F$ in a linear fashion. Hence, the linear matrix inequalities (LMI) [3], [10] techniques can be used to solve for the matrices $C_F, D_F$.

Proposition 5: (See P. Gahinet and P. Apkarian, "A linear matrix inequality approach to $\mathcal{H}_\infty$ control," *International Journal of Robust and Nonlinear Control*, vol. 4, pp. 421-448, 1994, which is incorporated herein by reference), for a given γ>0, the system K(z) satisfies $\|K\|_\infty < \gamma$ if and only if there exists a positive definite matrix P>0 such that $$\begin{bmatrix} A_K^T P A_K - P & A_K^T P B_K & C_K^T \\ B_K^T P A_K & B_K^T P B_K - \gamma^I & D_K^T \\ C_K & D_K & -\gamma^I \end{bmatrix} < 0. \quad (29)$$

For γ>0, Proposition 5 provides a tool to test if $\|K\|_\infty < \gamma$. Hence, γ can be iteratively decreased to get close to the optimal performance (within a predefined performance tolerance). Available implementations such as MATLAB's *LMI Control Toolbox* (P. Gahinet, A. Nemirovski, A. J. Laub, and M. Chilali, "LMI control toolbox," http://www.mathworks.com, 1995) can facilitate the design procedure.

Design Procedure

Inputs: Rational transfer functions $\{\Phi_i(s)\}_{i=0}^N$ (strictly proper), positive fractional delays $\{D_i\}_{i=1}^N$, the system tolerance delay $m_0 \geqq 0$, the sampling interval $h>0$, the superresolution rate $M \geqq 2$.

Outputs: FIR synthesis filters $\{F_i(z)\}_{i=1}^N$ or equivalently polyphase matrix $F(z)$.

1. Let $D_i=m_ih+d_i$, for $1 \leqq i \leqq N$, as in (5).
2. Compute a state-space realization $\{A_i,B_i,C_i,0\}$ of $\Phi_i(s)$ for $0 \leqq i \leqq N$.
3. Compute the system $G_d=\{A_d,B_d,C_d,0\}$ as in Proposition 1 and 2.
4. Compute a state-space realization of $H_i(z)$, for $0 \leqq i \leqq N$, as in Proposition 3.
5. Compute the state-space realization of $W(z)$ and $H(z)$ as in (24) and in (25) of Theorem 1.
6. Design a synthesis system $F(z)$ using Proposition 5.

Robustness Against Delay Uncertainties

The proposed design procedures for synthesis filters assume perfect knowledge of the delays $\{D_i\}_{i=1}^N$. In this section, it is shown that the induced error system $\mathcal{K}$ obtains nearly optimal performance if the synthesis filters are designed using estimates $\{\hat{D}_i\}_{i=1}^N$ sufficiently close to the actual delays $\{D_i\}_{i=1}^N$.

$\{\delta_1\}_{i=1}^N$ is denoted as the delay jitters $$\delta_i=D_i-\hat{D}_i,\ i=1, 2, \ldots N, \tag{30}$$

and $\bar{\delta}$ is the maximum jitter $$\bar{\delta} = \max_{i=1}^{N}\{|\delta_i|\}. \tag{31}$$

For convenience, the following operators are defined $$\Delta(s)=\mathrm{diag}_N(e^{-\delta_1 s}, \ldots, e^{-\delta_N s}), \tag{32}$$

$$\Phi(s)=\mathrm{diag}_N(\Phi_1(s), \ldots, \Phi_N(s)). \tag{33}$$

Figure 11D:
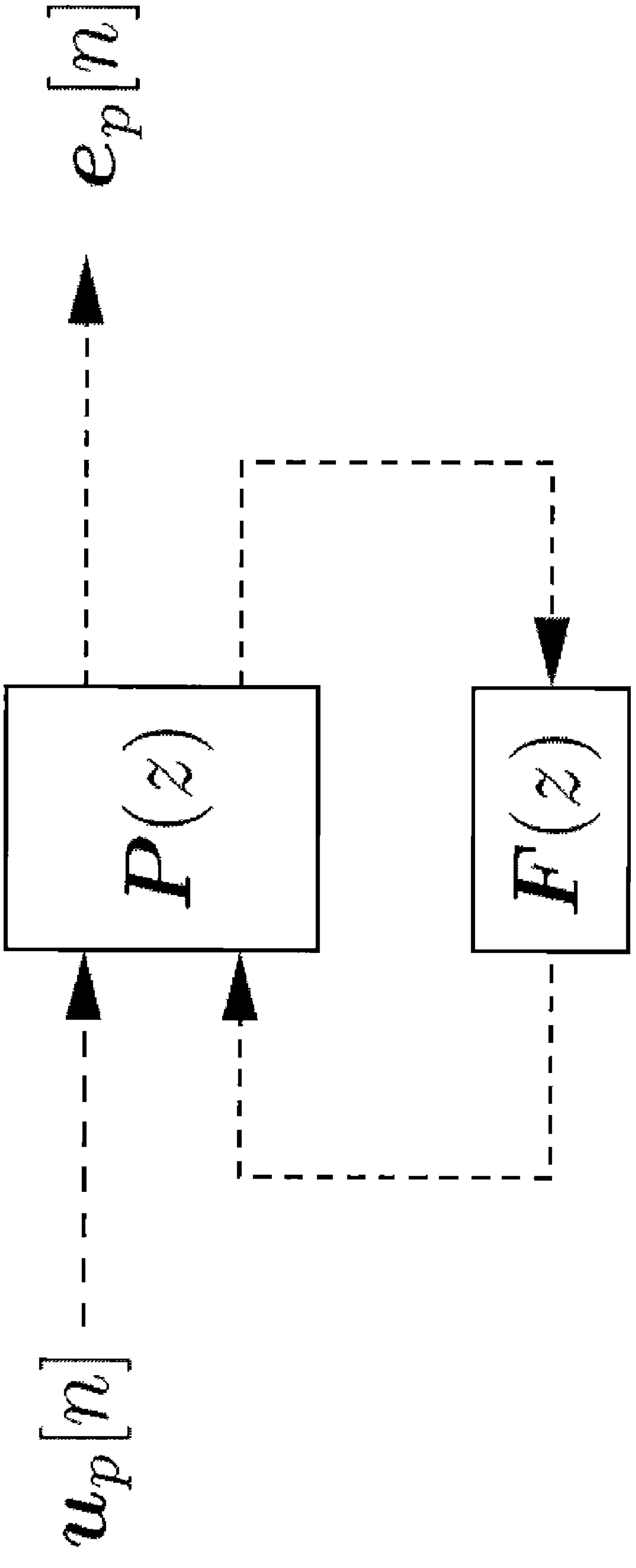
FIG. 11 illustrates a system including an uncertainty operator in accordance with an embodiment of the present disclosure.
Figure 11:
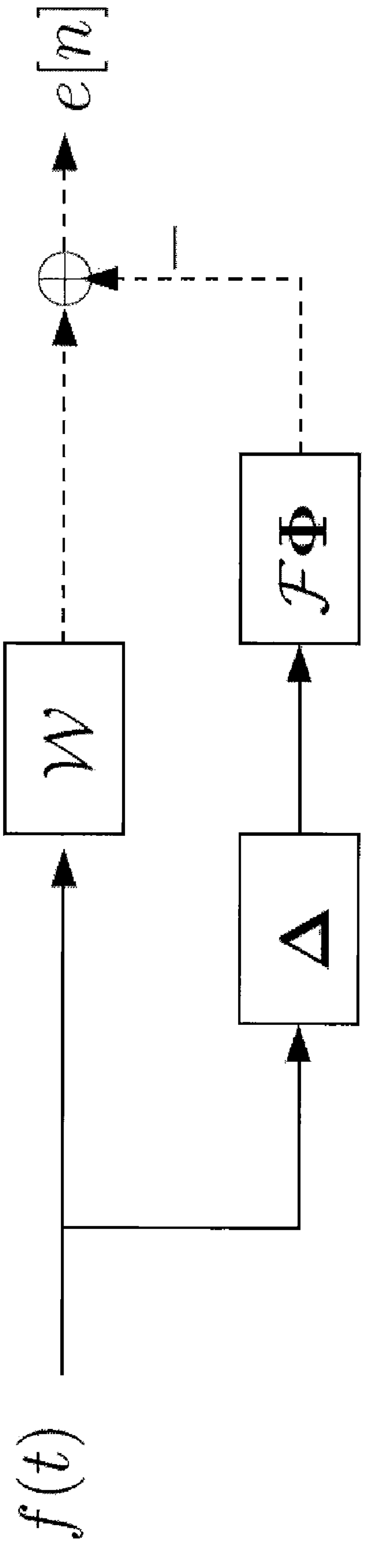

The induced error system $\mathcal{K}$, see FIG. 6, can be rewritten as in FIG. 11, where $\mathcal{W}$ represents the high-resolution channel of $\mathcal{K}$, and $\mathcal{F}$ signifies the hybrid MIMO system composed of the delay operators $\{e^{-D_is}\}_{i=1}^N$, the sampling operators $S_{Mh}$, the synthesis filters $\{F_i(z)\}_{i=1}^N$, and the summation of all the low resolution channels. FIG. 11 illustrates the hybrid system $\mathcal{K}$ and the uncertainty operator $\Delta$ caused by delay estimate errors. The uncertainty operator $\Delta$ only affects the low-resolution channels:

$$\mathcal{K} = \mathcal{W} - \mathcal{F}\Phi\Delta \tag{34}$$

It is easy to see that all the operators of the above equation, in particular $\mathcal{F}$, have bounded $\mathcal{H}_\infty$norm. Let $\bar{\omega} \in \mathbb{R}^+$ be an arbitrary, but fixed, positive number. The following Lemma gives a bound for the singular values of $I-\Delta(j\omega)$ and $\Phi(j\omega)$ for each frequency $\omega$.

Lemma 1: The maximum singular value of $I-\Delta(j\omega)$ and $\Phi(j\omega)$ can be bounded as:

$$\sigma_{max}[I-\Delta(j\omega)] \le \sqrt{2\bar{\delta}|\omega|}\ , \tag{35}$$

and $$\begin{cases} \sigma_{max}[\Phi(j\omega)] \le C_\Phi \big/ \sqrt{|\omega|} & \text{if } |\omega| > \bar{\omega} \\ \sigma_{max}[\Phi(j\omega)] \le C_\Phi & \text{if } |\omega| \le \bar{\omega} \end{cases} \tag{36}$$

where $C_\Phi$ is a constant depending on $\bar{\omega}$ and $\{\Phi_i\}_{i=1}^N$.

Proof: To show (35), observe that $$(I-\Delta(j\omega))\cdot(I-\Delta^*(j\omega))=\mathrm{diag}_N(2-2\cos(\delta_1\omega), \ldots, 2-2\cos(\delta_N\omega)). \tag{37}$$

Hence, the singular values of the operator $(I-\Delta(j\omega))$ are $$\{\sqrt{2-2\cos(\delta_i\omega)}\}_{i=1}^N.$$

Using $$1-\cos(x) \leqq |x|,\ x \in \mathbb{R}, \tag{38}$$

that can be easily verified, (35) is indeed proven.

To show (36), it is sufficient to note that $\Phi(j\omega)$ is a diagonal operator with strictly proper rational functions in the diagonal. Its maximum singular values hence decay at least as fast as $\mathcal{O}(|\omega|^{-1})$ when $|\omega|>\bar{\omega}$, and are bounded when $|\omega| \leqq \bar{\omega}$, which in fact implies (36).

The results of Lemma 1 may be used to derive the bound for the composite operator $\Phi-\Phi\Delta$ based on $\bar{\delta}$.

Proposition 6: The following inequality holds:

$$\|\Phi-\Phi\Delta\|_\infty \leqq \bar{C}\sqrt{\bar{\delta}}, \tag{39}$$

for some $\bar{C}>0$.

Proof: Let $u=\Phi f$ and $g=(I-\Delta)u$, then $g=(\Phi-\Delta\Phi)f$. Hence:

$$\begin{aligned}\|G(j\omega)\|_2 &= \|(I-\Delta(j\omega))\Phi(j\omega)F(j\omega)\|_2 \\ &\le \sigma_{max}[I-\Delta(j\omega)]\cdot\sigma_{max}[\Phi(j\omega)]\cdot\|F(j\omega)\|_2.\end{aligned}$$

Using the result of Lemma 1 for $\omega>\bar{\omega}$, $$\begin{aligned}\int_{|\omega|>\bar{\omega}} \|G(j\omega)\|_2^2 d\omega &\le \int_{|\omega|>\bar{\omega}} 2\bar{\delta}|\omega|\cdot\frac{C_\Phi^2}{|\omega|}\cdot\|F(j\omega)\|_2^2 d\omega \\ &\le 4\pi\bar{\delta}C_\Phi^2\cdot\|f\|_2^2.\end{aligned} \tag{40}$$

Similarly, for $\omega \leqq \bar{\omega}$, $$\begin{aligned}\int_{|\omega|\le\bar{\omega}} \|G(j\omega)\|_2^2 d\omega &\le \int_{|\omega|\le\bar{\omega}} 2\bar{\delta}|\omega|\cdot C_\Phi^2\cdot\|F(j\omega)\|_2^2 d\omega \\ &\le 4\pi\bar{\delta}C_\Phi^2\bar{\omega}\cdot\|f\|_2^2.\end{aligned} \tag{41}$$

From (40) and (41)

$$\|g\|_2 \leqq \bar{C}\cdot\|f\|_2, \tag{42}$$

for $$\bar{C}=2C_\Phi\sqrt{(\bar{\omega}+1)}. \tag{43}$$

Equation (42) indeed implies (39).

The following theorem shows the robustness of the induced error system $\mathcal{K}$ against the delay jitters $\{\delta_i\}_{i=1}^N$.

Theorem 2: In the presence of delay estimate errors, the induced error system $\mathcal{K}$ is robust in the sense that its $\mathcal{H}_\infty$norm is bounded as $$\|\mathcal{K}\|_\infty \leqq \|\mathcal{W}-\mathcal{F}\Phi\|_\infty+\sqrt{\bar{\delta}}\cdot\bar{C}\cdot\|\mathcal{F}\|_\infty, \tag{44}$$

where $\bar{\delta}$ is the maximum jitters and $C_\Phi$ is a constant defined as in (36).

Proof: Indeed:

$$\begin{aligned}\|\mathcal{K}\|_\infty &= \|\mathcal{W} - \mathcal{F}\Phi\Delta\|_\infty \\ &\le \|\mathcal{W} - \mathcal{F}\Phi\|_\infty + \|\mathcal{F}\Phi - \mathcal{F}\Phi\Delta\|_\infty \\ &\le \|\mathcal{W} - \mathcal{F}\Phi\|_\infty + \sqrt{\delta}\cdot\bar{C}\cdot\|\mathcal{F}\|_\infty\end{aligned}$$

A consequence of Theorem 2 is that the induced error system $\mathcal{K}$ is robust against the delay estimate errors $\{\delta_i\}_{i=1}^N$. In fact, its performance is degraded from the design performance $\|\mathcal{W}-\mathcal{F}\Phi\|_\infty$, in the worst case, by an additional term of order $\mathcal{O}(\sqrt{\delta})$.

Experimental Results

Presented below is an example of FIR filter design. Additionally, the performance of the proposed method is compared to existing methods.

Example of FIR Filter Design

The experimental setting is as follows:

Two channels are used to double the resolution; that is, M=N=2.

Figure 12:
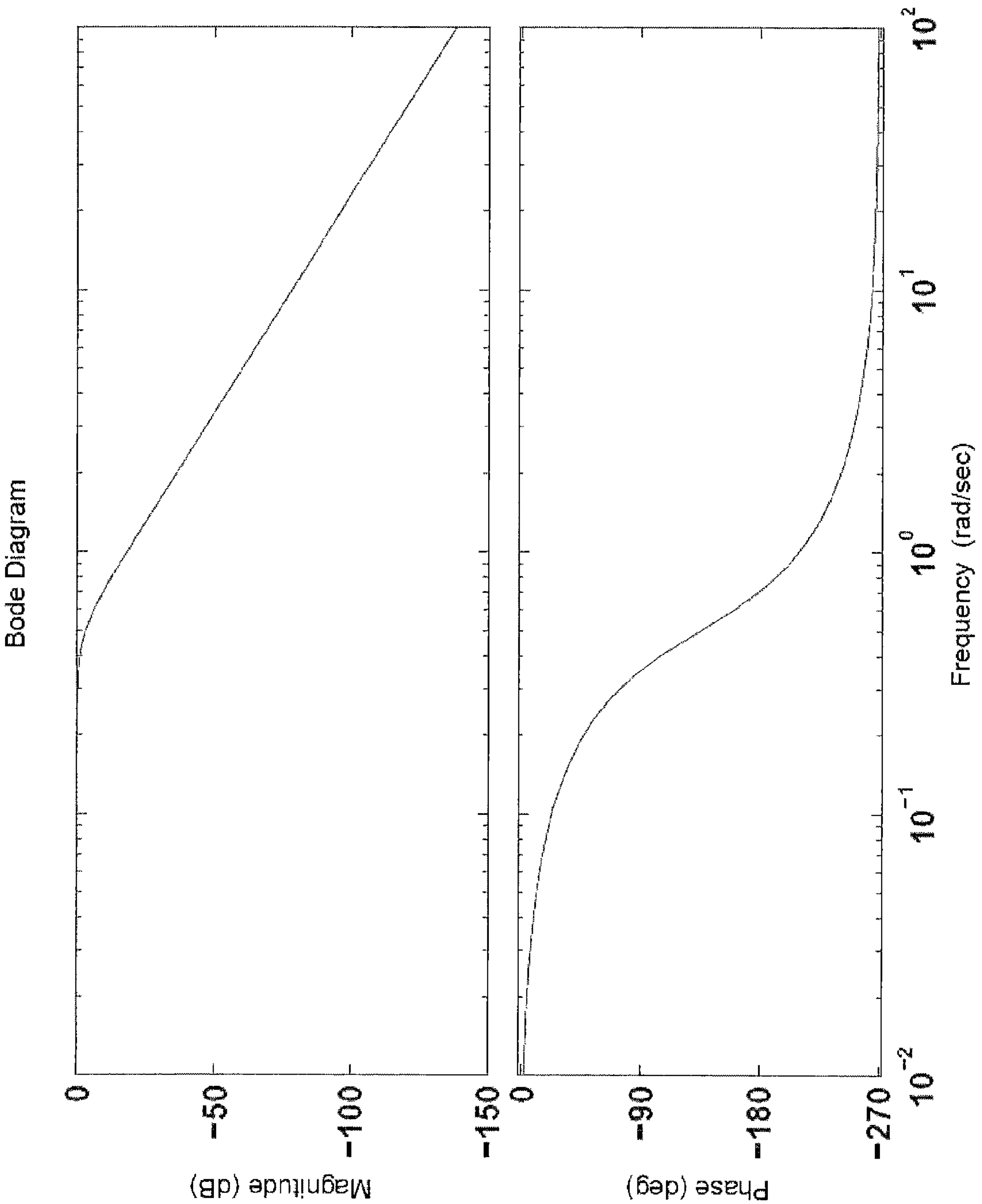
FIG. 12 is a bode diagram of a transfer function in accordance with an embodiment of the present disclosure.
Figure 11:
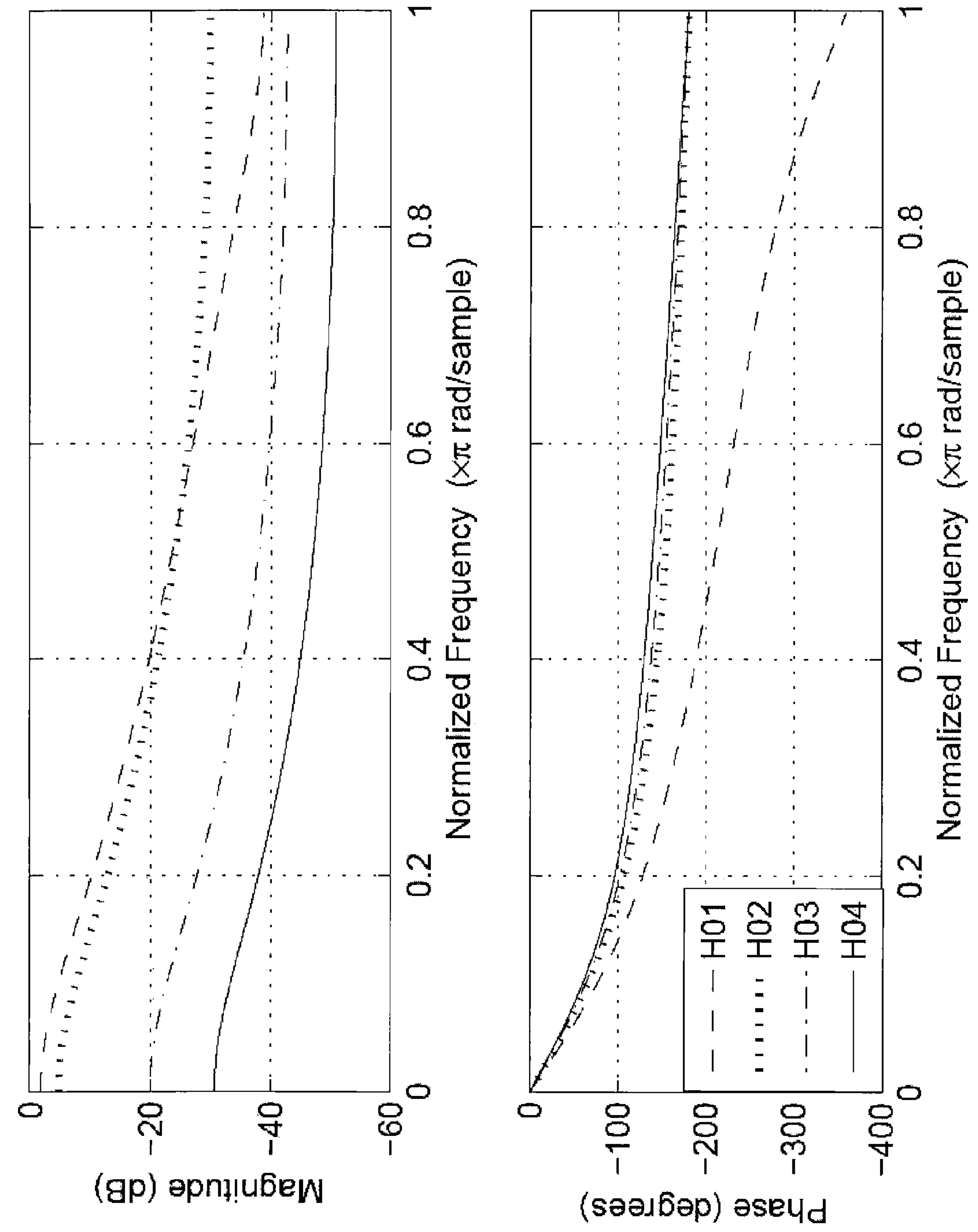

All functions $\Phi_1(s)=\omega_c^2/(s+\omega_c)^2$ for $\omega_c=0.5$ and i=0, 1, 2. FIG. 12 plots the Bode diagram of the transfer function $\Phi_i(s)$. FIG. 12 illustrates the magnitude and phase response of the transfer function $\Phi_i(s)$ modeling the measurement devices. $\Phi_i(s)=\Phi(s)$ for i=0, 1, 2.

Input signal is a step function:

$$f(t) = \begin{cases} 0 & t < 0.3 \\ 1 & t \ge 0.3 \end{cases} \quad (45)$$

m=10, h=1, $D_1=1.2$, $D_2=0.6$.

Maximum filter length is nM=22.

Figure 14:
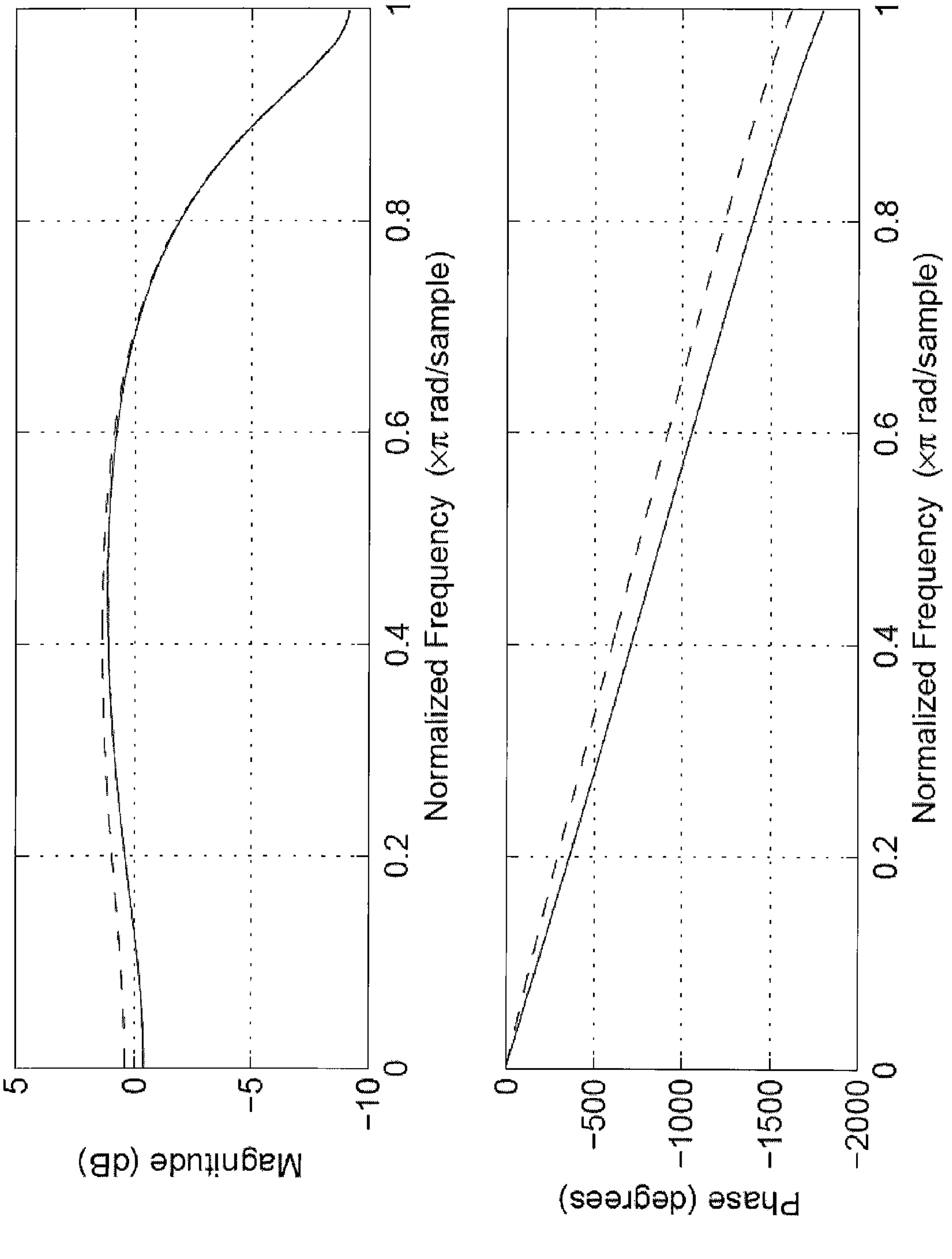
FIG. 14 illustrates a magnitude response and phase response of synthesis filters in accordance with an embodiment of the present disclosure.
Figure 15:
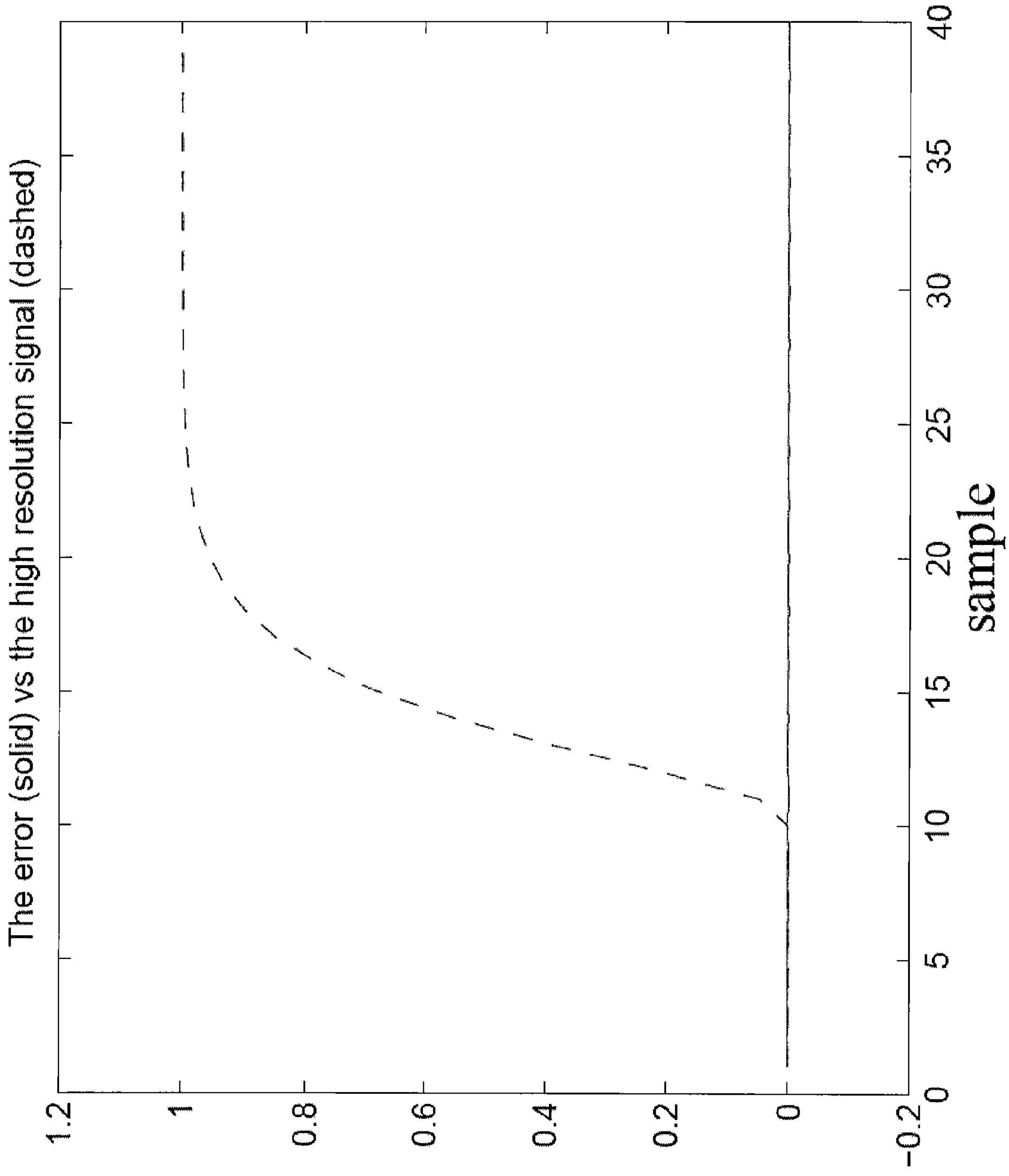
FIG. 15 is a graph illustrating an error in accordance with an embodiment of the present disclosure.

In FIG. 13, equivalent filters $H_0(z)$ of the first channel are shown. Note that $H_i(z)$, for i=0, 1, 2, take multiple inputs (in this case $n_u=4$ inputs, hence 4 filters for each $H_i(z)$ are required). The magnitude and phase response of the designed filters $F_1(z)$,$F_2(z)$ are shown in FIG. 14. In FIG. 15, the error e[n] of the induced system (solid) is shown and the desired output $y_0[n]$ (dashed). The $\mathcal{H}_\infty$ norm of the system is $\|\mathcal{K}\|_\infty\approx 4\%$. Observe that the induced error e[n] is small compared to the desired signal $y_0[n]$.

Figure 16:
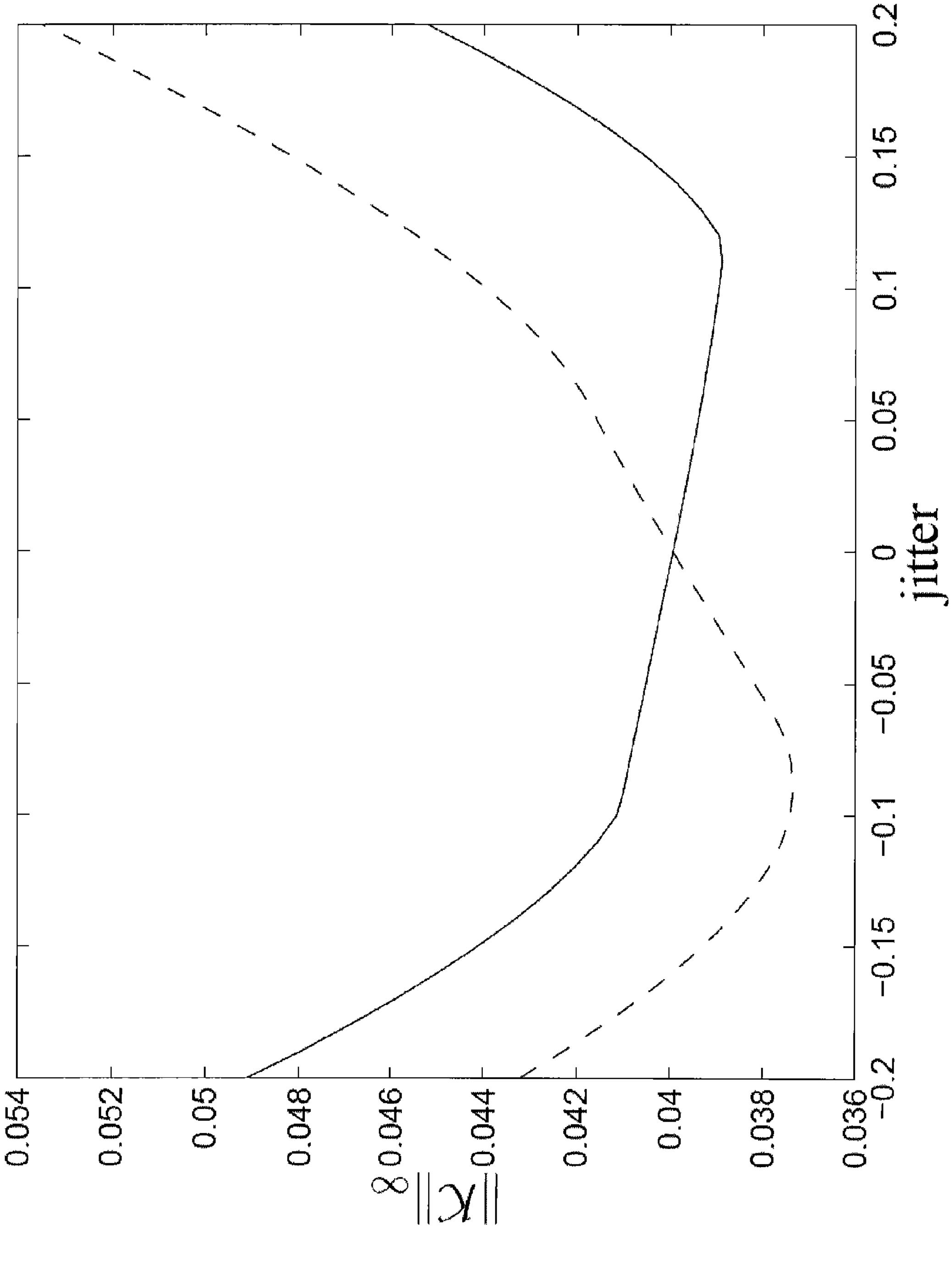
FIG. 16 is a graph illustrating jitter in accordance with an embodiment of the present disclosure.

The robustness of $\mathcal{K}$ against jitters $\{\delta_i\}_{i=1,2}$ is also tested. The synthesis filters are designed for $\hat{D}_1=1.2$ h and $\hat{D}_2=0.6$ h, but the system uses inputs produced with jittered time delays $D_1$,$D_2$. FIG. 16 shows the $\mathcal{H}_\infty$ norm of the induced errors plotted against jitters in $\delta_1$ (solid) and $\delta_2$ (dashed). The errors are observed to be robust against delay estimate errors. Note that the intersection of two curves (where no jitter is present) is not necessarily a local minima of either curves.

Comparison to Existing Methods

The proposed method is compared to an existing method, called the Sin c method. The Sin c method tested here approximates the fractional delay operator $e^{-Ds}$ by an FIR filter using the function sin $c(x)=\sin(\pi x)/(\pi x)$:

$$F_D^{(sinc)}[n] = \text{sinc}\left(n - \frac{D}{2h}\right),$$

with $|n| \leqq N_{cutoff}=11$. Hence, tested filters of the Sin c method are of 23 taps. Note that, in the formula above, the sampling interval is 2 h.

The Sin c method filters the low resolution signal $x_1[n]$ by the approximated FIR filter $F_{D_1}^{(sin\ c)}$ to get the even samples of $y_0[n]$, and filters the second low resolution signal $x_2[n]$ by the approximated FIR filter $F_{D_{2+h}}^{(sin\ c)}$ to get the odd samples of $y_0[n]$. In other words, the high resolution signal is obtained by interleaving individually filtered low resolution channels.

Figure 17:
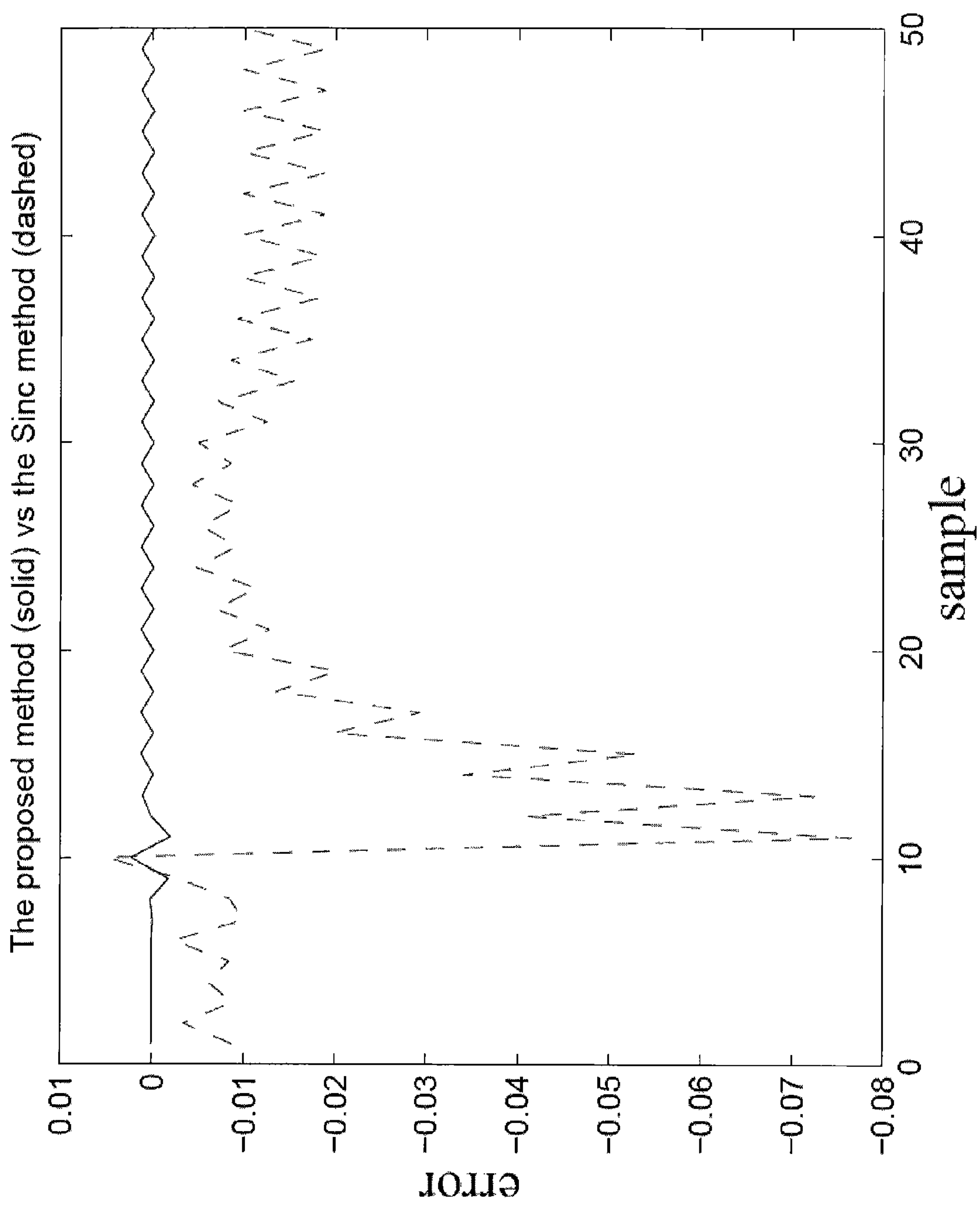
FIG. 17 is a graph illustrating error signals in accordance with an embodiment of the present disclosure.

FIG. 17 compares the error of the proposed method to the error of the Sin c method. Both sets of synthesis filters have similar length (length 23 taps for the Sin c method and length 22 taps for the proposed method). It may be observed that the proposed method shows a better performance, especially around the discontinuity.

The improved performance of the proposed technique in FIG. 17 is due to two reasons. First, replacing fractional delays $\{e^{-D_is}\}_{i=1}^N$ by equivalent analysis filters $\{H_i(z)\}_{i=1}^N$ enhances the results. Second, the use of $\mathcal{H}_\infty$ optimization allows the system to perform even for inputs that are not necessarily bandlimited.

The proposed method may also be compared to a second method, called the Separation method. This method, similar to the Sin c method above, obtains the high resolution signal by interleaving individually processed low resolution channels. What distinguishes the Separation method from the Sin c method is that the Separation method approximates the fractional delay operator $e^{-Ds}$ by an FIR operator designed to minimize the $\mathcal{H}_\infty$ norm of an induced error system [22].

Figure 18:
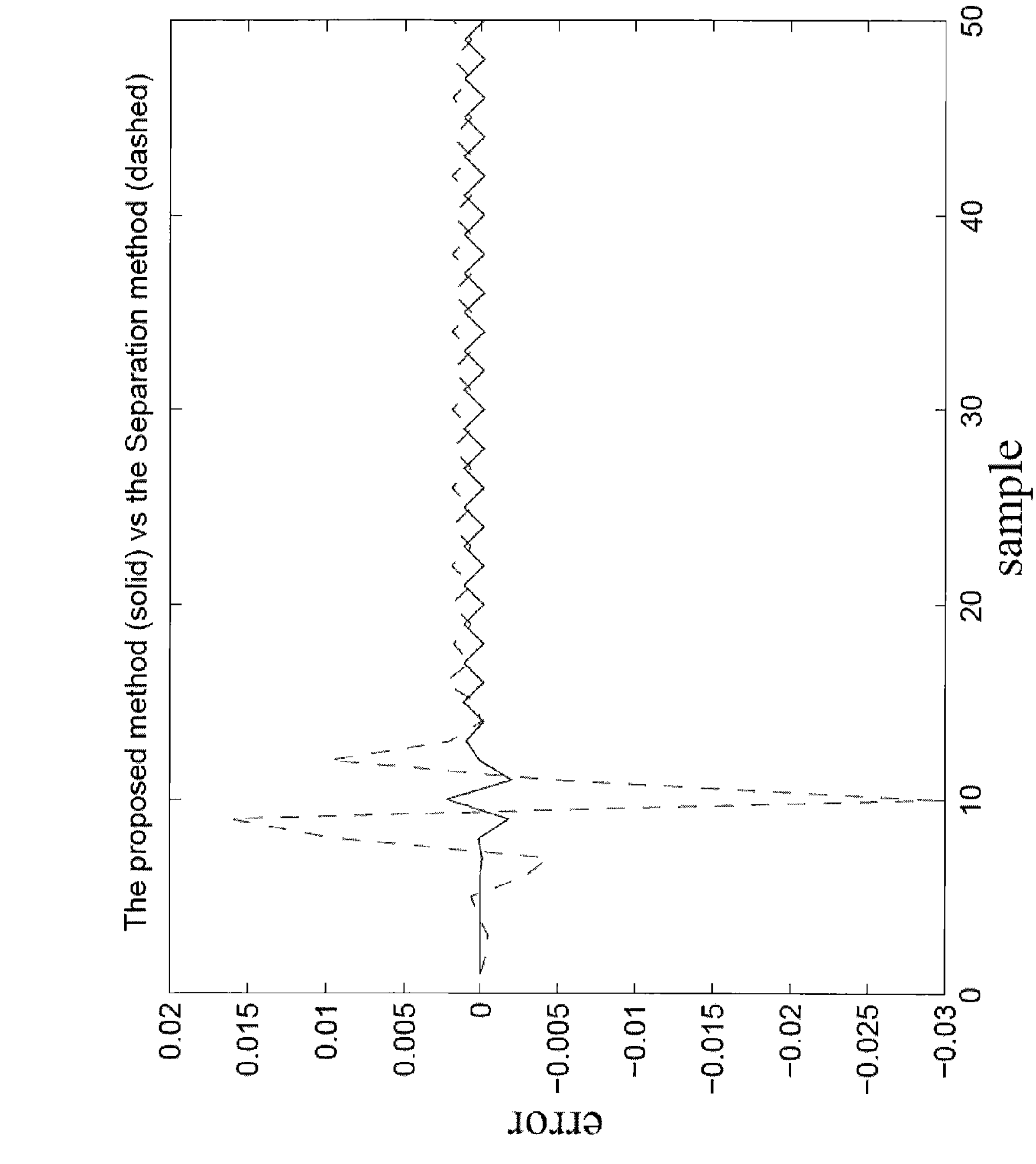
FIG. 18 is a graph illustrating error signals in accordance with an embodiment of the present disclosure.

FIG. 18 compares the error of the proposed method and the Separation method, all synthesis filters are of length 22. Again, the proposed method hence yields a better performance. This is expected as the synthesis filters are designed together, allowing effective joint processing of all low resolution signals.

Table I shows the comparison of the three methods for two inputs of different characteristics: a step function as in (45) and a bandlimited function f(t)=cos(0.3t)+cos(0.8t). Synthesis filters of 23 taps are used for the Sin c method and of 22 taps are used for the Separation and proposed methods. The errors are compared in terms of the root mean square error (RMSE), the maximum value (Max), and the average value in steady-state regime (SS) when the step function in (45) is used as input. As observed in FIG. 17 and FIG. 18, in the steady-state regime, the system errors are periodic (with period 2). Hence the errors alternate between two values; the steady-state error in Table I is computed as the average of these two values. As can be seen, the proposed method consistently outperforms existing methods.

TABLE 1

Performance comparison in root mean square error (RMSE), maximum error (Max), and steady-state error (SS). The length of synthesis filters are 23 for the Sinc method and 22 for the Separation and proposed method. First three columns use the step function in (45) as input. The last two columns use input f(t) = cos(0.3t) + cos(0.8t).

| | $RMSE_1$ | $MAX_1$ | SS | $RMSE_2$ | $MAX_2$ |
|---|---|---|---|---|---|
| Sinc | 0.0171 | 0.0765 | −0.0143 | 0.0689 | 0.1777 |
| Separation | 0.0029 | 0.0293 | 0.0018 | 0.0092 | 0.0506 |
| Proposed | 0.0008 | 0.0023 | 0.0006 | 0.0019 | 0.0079 |

A paper titled "Robust Multichannel Sampling" (*IEEE International Conference on Image Processing*, San Diego, 2008 by H. T. Nguyen and M. N. Do), written by the inventors, is incorporated by reference.

In compliance with the statute, embodiments of the invention have been described in language more or less specific as to structural and methodical features. It is to be understood, however, that the entire invention is not limited to the specific features and/or embodiments shown and/or described, since the disclosed embodiments comprise forms of putting the invention into effect. The invention is, therefore, claimed in any of its forms or modifications within the proper scope of the appended claims appropriately interpreted in accordance with the doctrine of equivalents.

The invention claimed is:

1. A signal processor comprising:

a common node;

a plurality of channels, each channel of the plurality comprising an analog filter, a sampler, and a digital filter and each channel of the plurality being configured to generate an intermediate digital signal using an analog signal presented at the common node; and processing circuitry configured to form a digital signal representing the analog signal from the intermediate digital signals.

2. The signal processor of claim 1 wherein the intermediate digital signals have individual sample rates and the sum of the individual sample rates is not equal to a sample rate of the digital signal representing the analog signal.

3. The signal processor of claim 1 wherein transfer functions of the analog filters are different relative to one another.

4. The signal processor of claim 3 wherein the transfer functions have different center frequencies relative to one another.

5. The signal processor of claim 3 wherein the transfer functions have different passbands relative to one another and at least some of the passbands do not overlap in frequency.

6. The signal processor of claim 1 wherein the digital filters are configured to operate using filter parameters determined using transfer functions of the analog filters.

7. The signal processor of claim 1 wherein the digital filters are finite impulse response filters.

8. The signal processor of claim 1 wherein the digital filters are configured to operate using filter parameters determined using information related to propagation delays experienced by a signal propagating from the common node to the samplers.

9. A signal processing method comprising:

using a first sampling device, sampling an analog signal to produce a first digital signal having a first sampling rate;

using a second sampling device, sampling the analog signal to produce a second digital signal having a second sampling rate; and using the first digital signal and the second digital signal, forming a third digital signal having a third sampling rate, the third sampling rate being greater than both the first rate and the second rate.

10. The method of claim 9 wherein the first sampling rate is different from the second sampling rate.

11. The method of claim 9 further comprising using a third sampling device, sampling the analog signal to produce a fourth digital signal having a fourth sampling rate and wherein the forming of the third digital signal comprises forming the third digital signal using the fourth digital signal and wherein the third sampling rate is greater than the fourth sampling rate.

12. The method of claim 9 wherein the forming of the third digital signal comprises interleaving samples of the first digital signal with samples of the second digital signal.

13. The method of claim 9 further comprising prior to the forming of the third digital signal:

upsampling the first digital signal to have the third sampling rate;

upsampling the second digital signal to have the third sampling rate; and wherein the forming of the third digital signal comprises forming the third digital signal using the upsampled first digital signal and the upsampled second digital signal.

14. A digital filter configuration method comprising:

accessing information describing characteristics of an analog to digital converter, the analog to digital converter being configured to form a digital signal representing an analog signal from a plurality of intermediate digital signals generated respectively by a plurality of channels of the analog to digital converter configured to sample the analog signal, each channel of the plurality comprising a different digital filter relative to one another;

using the information to determine filter parameters for the digital filters; and configuring the digital filters with the filter parameters.

15. The method of claim 14 wherein each channel of the plurality comprises a different analog filter relative to one another and the information describes transfer functions of the analog filters.

16. The method of claim 14 wherein each channel of the plurality comprises a different sampler relative to one another and the information describes sampling rates of the samplers.

17. The method of claim 14 wherein the plurality of channels consists of a particular quantity of channels and the information indicates the particular quantity.

18. The method of claim 14 wherein each channel of the plurality comprises a different sampler relative to one another and the information is based on propagation delays between a node common to the channels of the plurality and the samplers.

19. The method of claim 18 wherein the sampler of a first one of the channels is configured to operate at a sampling rate and the propagation delay between the common node and the sampler of the first one of the channels is an irrational multiple of a sampling interval associated with the sampling rate.

20. The method of claim 14 wherein the determining of the filter parameters comprises using a portion of the information related to a first one of the channels to determine a subset of the filter parameters and the configuring comprises configuring the digital filter of a second one of the channels with the subset of the filter parameters.

* * * * *